(12) United States Patent
Okuno

(10) Patent No.: US 10,438,793 B2
(45) Date of Patent: *Oct. 8, 2019

(54) PRODUCTION METHOD FOR SEMICONDUCTOR STRUCTURE AND PRODUCTION METHOD FOR SEMICONDUCTOR DEVICE

(71) Applicant: TOYODA GOSEI CO., LTD., Kiyosu-shi (JP)

(72) Inventor: Koji Okuno, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/836,595

(22) Filed: Dec. 8, 2017

(65) Prior Publication Data

US 2018/0182615 A1 Jun. 28, 2018

(30) Foreign Application Priority Data

Dec. 28, 2016 (JP) .................................. 2016-257143

(51) Int. Cl.
*H01L 21/02* (2006.01)
*H01L 29/778* (2006.01)
(Continued)

(52) U.S. Cl.
CPC ...... *H01L 21/0243* (2013.01); *H01L 21/0242* (2013.01); *H01L 21/0254* (2013.01);
(Continued)

(58) Field of Classification Search
CPC ........... H01L 21/0243; H01L 21/02488; H01L 21/02667; H01L 21/0259; H01L 21/02532;
(Continued)

(56) References Cited

U.S. PATENT DOCUMENTS 6,946,370 B2 9/2005 Koike et al.
2004/0241966 A1 12/2004 Koike et al.
(Continued)

FOREIGN PATENT DOCUMENTS

JP 2000-031591 A 1/2000
JP 2003-055097 A 2/2003
(Continued)

OTHER PUBLICATIONS

United States Office Action dated May 7, 2019 in U.S. Appl. No. 15/922,714.

(Continued)

*Primary Examiner* — Syed I Gheyas
(74) *Attorney, Agent, or Firm* — McGinn IP Law Group, PLLC.

(57) ABSTRACT

There are provided a method for producing a semiconductor structure exhibiting excellent crystallinity by preventing the occurrence of a strain, and a method for producing a semiconductor device. The semiconductor structure production method includes a decomposition layer formation step, a bridging portion formation step, a decomposition step, and a semiconductor layer formation step. In the decomposition layer formation step, a plurality of threading dislocations are extended during growth of a decomposition layer. In the bridging portion formation step, the threading dislocations are exposed to the surface of the bridging portion. In the decomposition step, the threading dislocations exposed to the surface of the bridging portion are widened to thereby provide a plurality of through holes penetrating the bridging portion, and the decomposition layer exposed in the interior of the through holes is decomposed.

20 Claims, 17 Drawing Sheets

(51) Int. Cl.
*H01L 33/22* (2010.01)
*H01L 33/00* (2010.01)
*H01L 33/12* (2010.01)

(52) U.S. Cl.
CPC .. *H01L 21/02458* (2013.01); *H01L 21/02505* (2013.01); *H01L 21/02532* (2013.01); *H01L 21/02658* (2013.01); *H01L 29/7787* (2013.01); *H01L 33/007* (2013.01); *H01L 33/12* (2013.01); *H01L 33/22* (2013.01); *H01L 21/02502* (2013.01); *H01L 2933/0083* (2013.01)

(58) Field of Classification Search
CPC ........... H01L 21/02658; H01L 21/0254; H01L 21/02458; H01L 21/0242; H01L 21/02502
See application file for complete search history.

(56) References Cited

U.S. PATENT DOCUMENTS

| | | |
|---|---|---|
| 2011/0233519 A1 | 9/2011 | Cheng |
| 2014/0339565 A1 | 11/2014 | Choi |
| 2015/0228848 A1 | 8/2015 | Miyoshi et al. |
| 2016/0149073 A1 | 5/2016 | Shu |
| 2018/0286671 A1* | 10/2018 | Okuno .............. H01L 21/02458 |

FOREIGN PATENT DOCUMENTS

| | | |
|---|---|---|
| JP | 3823775 B | 9/2006 |
| JP | 4035971 B2 | 1/2008 |
| JP | 2013-241337 A | 12/2013 |
| JP | 2015-153826 A | 8/2015 |
| WO | WO 03/021012 A1 | 3/2003 |

OTHER PUBLICATIONS

United States Office Action dated Dec. 13, 2018 in U.S. Appl. No. 15/922,714.

* cited by examiner

PRODUCTION METHOD FOR SEMICONDUCTOR STRUCTURE AND PRODUCTION METHOD FOR SEMICONDUCTOR DEVICE

BACKGROUND OF THE INVENTION

Field of the Invention

The technique disclosed in the present specification relates to a method for producing a semiconductor structure and to a method for producing a semiconductor device.

Background Art

In general, the production of a semiconductor device involves growth of a semiconductor layer on a growth substrate. In the case where the material of the growth substrate differs from that of the semiconductor layer, a strain or a lattice defect (due to a lattice mismatch) may occur at the interface between the growth substrate and the semiconductor layer. The occurrence of a strain may cause poor crystallinity of the semiconductor layer. The strain also causes an internal stress in the semiconductor layer. The internal stress in the semiconductor layer generates a piezoelectric field. The piezoelectric field affects the behavior of electrons in the semiconductor device. Therefore, desirably, the strain in the semiconductor layer is relaxed.

For example, Patent Document 1 discloses a technique for providing a superlattice layer and a layered structure of thin films, thereby relaxing an interfacial strain (see paragraphs [0017] and [0018] of Patent Document 1). This technique improves the crystallinity of the resultant semiconductor layer.

Patent Document 1: Japanese Patent Application Laid-Open (kokai) No. 2000-031591

However, the aforementioned technique cannot prevent occurrence of a strain at the interface between the growth substrate and the semiconductor layer. Thus, desirably, the occurrence of a strain is prevented, thereby growing a semiconductor layer exhibiting excellent crystallinity.

SUMMARY OF THE INVENTION

The technique disclosed in the present specification has been accomplished for solving problems involved in the aforementioned conventional technique. Accordingly, an object of the technique disclosed in the present specification is to provide a method for producing a semiconductor structure exhibiting excellent crystallinity by preventing the occurrence of a strain. Another object of the technique is to provide a method for producing a semiconductor device.

In a first aspect of the disclosure, there is provided a method for producing a semiconductor structure, the method comprising: a step of forming a layer to be removed through decomposition (hereinafter referred to as a "a decomposition layer") on a substrate; a step of forming a bridging portion on the decomposition layer; a step of decomposing the decomposition layer; and a step of forming at least one semiconductor layer on the bridging portion. In the decomposition layer formation step, a plurality of threading dislocations are extended during growth of the decomposition layer. In the bridging portion formation step, the threading dislocations are exposed to the surface of the bridging portion. In the decomposition step, the threading dislocations exposed to the surface of the bridging portion are widened to thereby provide a plurality of through holes penetrating the bridging portion, and the decomposition layer exposed in the interior of the through holes is decomposed.

In the semiconductor structure production method, easily decomposable portions of the bridging portion corresponding to the threading dislocations are widened to thereby provide a plurality of through holes. The decomposition layer exposed in the interior of the through holes is then decomposed. Accordingly, only the decomposition layer is removed without removal of the bridging portion. No underlying layer is present between the bridging portion and the substrate. Thus, the bridging portion does not undergo a strain from an underlying layer. The bridging portion may undergo a slight strain at only a small number of positions where it is in contact with the substrate. However, the strain is considerably reduced as compared with conventional cases.

In the present specification, there are provided a method for producing a semiconductor structure exhibiting excellent crystallinity by preventing the occurrence of a strain, and a method for producing a semiconductor device.

BRIEF DESCRIPTION OF THE DRAWINGS

Various other objects, features, and many of the attendant advantages of the present technique will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
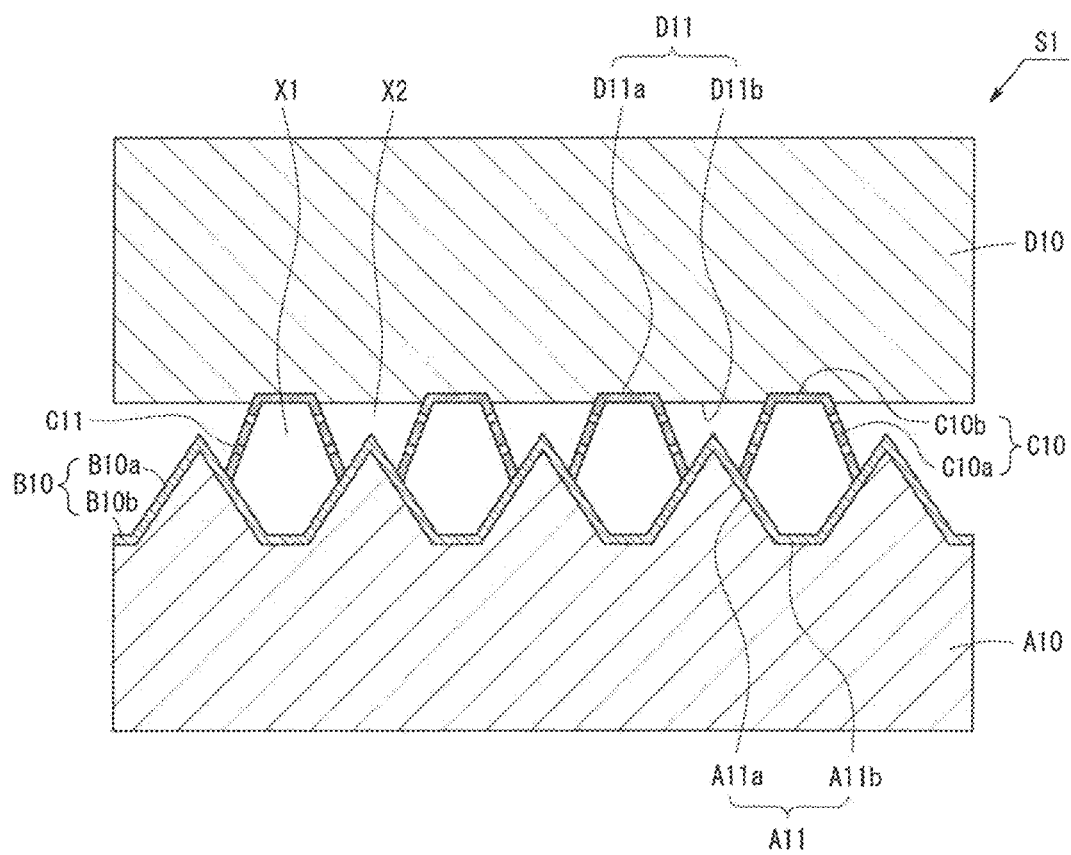
FIG. 1 schematically shows the configuration of a semiconductor structure of a first embodiment.

Specific embodiments will next be described with reference to the drawings by taking, as an example, a method for producing a semiconductor structure and a method for producing a semiconductor device. However, the technique disclosed in the present specification should not be limited to these embodiments. In the below-described semiconductor device, the layered structure of each layer and the structure of each electrode are shown for an exemplary purpose. Needless to say, the layered structure may differ from that described below in the embodiments. The thickness proportion of each layer which is schematically shown in the drawings does not correspond to its actual value. In some drawings, the thickness is not taken into account.

First Embodiment

1. Semiconductor Structure

FIG. 1 schematically shows the configuration of a semiconductor structure S1 of a first embodiment. The semiconductor structure S1 is a substrate having a semiconductor layer formed thereon. That is, the semiconductor structure S1 is a type of substrate having an epitaxial layer formed thereon. Thus, the semiconductor structure S1 may be used as a self-standing substrate or a template substrate. As described in the embodiments hereinbelow, the semiconductor structure S1 includes a semiconductor device, such as a semiconductor light-emitting device or a power device.

FIG. 1 is a somewhat enlarged view of an unevenly shaped portion of the substrate and the structure of a portion around the unevenly shaped portion. The semiconductor structure S1 includes a substrate A10, a buffer layer B10, bridging portions C10, and a semiconductor layer D10. In FIG. 1, for example, the unevenly shaped portion of the substrate is enlargedly shown for the sake of easy understanding. The same shall apply to the other drawings described below.

The substrate A10 is an uneven substrate having an unevenly shaped portion A11. The unevenly shaped portion A11 has a plurality of protrusions A11a and a bottom portion A11b. The protrusions A11a extend from the bottom portion A11b toward the outside of the substrate A10. The protrusions A11a have a conical shape. Thus, each of the protrusions A11a has a side face inclined to the main surface of the substrate A10. The protrusions A11a are arranged in a honeycomb pattern with respect to the bottom portion A11b. The substrate A10 is formed of sapphire. The substrate A10 may be formed of a material other than sapphire; for example, SiC, Si, ZnO, GaN, AlN, $MgAl_2O_4$, or $Ga_2O_3$. The substrate A10 may be an amorphous substrate formed of, for example, glass.

The buffer layer B10 is provided for transferring the crystallinity of the substrate A10 to a layer grown above the buffer layer B10. The buffer layer B10 has sloped portions B10a and a bottom portion B10b. The buffer layer B10 has a very small thickness. Thus, the buffer layer B10 is formed so as to follow the shape of the unevenly shaped portion A11 of the substrate A10. The sloped portions B10a of the buffer layer B10 are formed at positions facing the protrusions A11a of the substrate A10. The bottom portion B10b of the buffer layer B10 is formed at a position facing the bottom portion A11b of the substrate A10. The buffer layer B10 is formed of AlN. The buffer layer B10 has a thickness of 1 nm to 100 nm. The buffer layer B10 may have a thickness other than that described above.

The bridging portions C10 are bridged to the substrate A10. The bridging portions C10 are located between the substrate A10 and the semiconductor layer D10. Each of the bridging portions C10 has a leg portion C10a and a top portion C10b. The leg portion C10a is integrated with the top portion C10b. The leg portion C10a supports the top portion C10b and the semiconductor layer D10. The leg portion C10a is formed so as to extend from the protrusion A11a of the substrate A10. That is, the bridging portion C10 is bridged to the substrate A10 by means of the leg portion C10a. In this case, the bridging portion C10 is supported by the side face of the protrusion A11a of the substrate A10. At least a portion of the leg portion C10a is not in contact with the semiconductor layer D10. The top portion C10b has a flat surface. The top portion C10b is in direct contact with the semiconductor layer D10. The bridging portions C10 are formed of AlN.

The semiconductor layer D10 includes one or more semiconductor layers. The semiconductor layer D10 is formed on the top portions C10b of the bridging portions C10. The semiconductor layer D10 is in contact with a portion of the leg portion C10a of each bridging portion C10 and is in contact with the top portion C10b of the bridging portion C10. The semiconductor layer D10 has a surface D11 on the substrate A10 side, and the surface D11 has a first site D11a and a second site D11b. The first site D11a is in contact with the top portion C10b of each bridging portion C10. The second site D11b is not in contact with the bridging portion C10. The second site D11b slightly protrudes from the top portion C10b of the bridging portion C10 toward the substrate A10. The second site D11b faces the leg portion C10a of the bridging portion C10 and the protrusion A11a of the substrate A10.

2. Bridging Portion and Void 2-1. Shape of Bridging Portion

Figure 2:
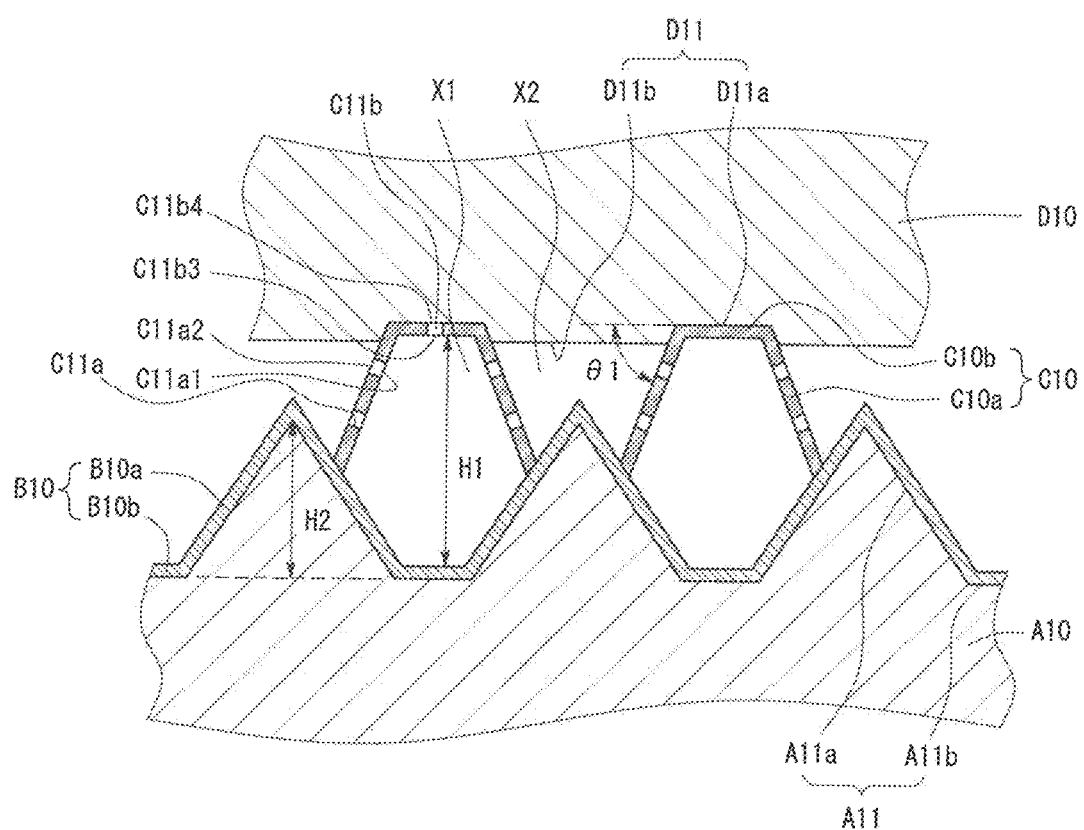
FIG. 2 is an enlarged view of a region around bridging portions in the semiconductor structure of the first embodiment.

FIG. 2 is an enlarged view of a region around the bridging portions C10. As shown in FIG. 2, the bridging portions C10 are formed so as to extend from the sloped portions B10a of the buffer layer B10. The bridging portions C10 are supported by the protrusions A11a of the substrate A10. As shown in FIG. 2, the angle θ1 between the leg portion C10a of each bridging portion C10 and the top portion C10b of the bridging portion C10 is 10° to 90°.

The bridging portions C10 have approximately the same height. Thus, the height at a position of each bridging portion C10 as measured from the bottom portion A11b of the substrate A10 falls within a range of ±10% of the average height of the bridging portion C10 as measured from the bottom portion A11b.

2-2. Region of Bridging Portion

The bridging portions C10 are formed along the bottom portion A11b of the substrate A10. In particular, the top portions C10b of the bridging portions C10 are located at positions facing the bottom portion A11b of the substrate A10. The semiconductor layer D10 is grown from the top portions C10b.

2-3. Thickness of Bridging Portion

The thickest portion of each bridging portion C10 has a thickness of 0.25 nm to 100 nm, preferably 0.5 nm to 60 nm, more preferably 1 nm to 30 nm. The thickness of each bridging portion C10 may be equal to or greater than a level such that the bridging portion C10 can support the semiconductor layer D10. If the bridging portions C10 have a large thickness, the below-described etching process requires a long period of time. The preferred thickness may depend on the material of the bridging portions C10. If the bridging portions C10 contain Al, the bridging portions C10 may have a large lattice mismatch with the decomposition layers described below. Thus, if the below-described decomposition layers (E1) are formed of GaN and the bridging portions C10 are formed of AlN, the bridging portions C10 preferably have a small thickness.

The leg portions C10a may have a thickness greater than that of the top portions C10b. In such a case, the leg portions C10a exhibit high mechanical strength. Alternatively, the leg portions C10a may have a thickness smaller than that of the top portions C10b. In such a case, the semiconductor layer D10 can be readily removed from the substrate A10.

2-4. Through Hole of Bridging Portion

As shown in FIG. 2, each bridging portion C10 has a plurality of through holes. Specifically, the bridging portion C10 has first through holes C11a provided in the leg portion C10a, and second through holes C11b provided in the top portion C10b. The leg portion C10a of the bridging portion C10 has a relatively large number of first through holes C11a. The number of the first through holes C11a of the leg portion C10a is greater than that of the second through holes C11b of the top portion C10b. The density of the first through holes C11a of the leg portion C10a is higher than that of the second through holes C11b of the top portion C10b.

As described below, the first through holes C11a and the second through holes C11b are caused by threading dislocations. The first through holes C11a and the second through holes C11b may have any cross-sectional shape; for example, a circular shape, an elliptical shape, a polygonal shape (e.g., a hexagonal shape), or a striped shape. Two or more through holes caused by two or more threading dislocations may be connected together, thereby providing a relatively large through hole.

Each second through hole C11b extends from the substrate A10 side toward the semiconductor layer D10. One opening of the second through hole C11b is blocked with the semiconductor layer D10. Thus, at least one of the openings of the through hole is blocked with the semiconductor layer D10. Hence, the semiconductor layer D10 has no through holes.

Each first through hole C11a has a first opening C11a1 and a second opening C11a2. The first opening C11a1 is open toward a first void X1 described below. The second opening C11a2 is not blocked with the semiconductor layer D10, but is open toward a second void X2 described below.

Each second through hole C11b has a third opening C11b3 and a fourth opening C11b4. The third opening C11b3 is open toward a first void X1 described below. The fourth opening C11b4 is blocked with the semiconductor layer D10. As described above, both of the third opening C11b3 and the fourth opening C11b4 may be blocked with the semiconductor layer D10. In such a case, the semiconductor layer D10 grows through the fourth opening C11b4 and reaches the third opening C11b3.

2-5. Void

As shown in FIG. 2, the semiconductor structure S1 has first voids X1 and second voids X2 defined between the unevenly shaped portion A11 of the substrate A10 and the semiconductor layer D10.

Each first void X1 is defined by the unevenly shaped portion A11 of the substrate A10 and the bridging portion C10. More specifically, the first void X1 is defined by the bottom portion A11b of the substrate A10, a portion of the protrusion A11a of the substrate A10, the leg portion C10a of the bridging portion C10, and the top portion C10b of the bridging portion C10. In other words, the first void X1 is defined by the bottom portion B10b of the buffer layer B10, a portion of the sloped portion B10a of the buffer layer B10, the leg portion C10a of the bridging portion C10, and the top portion C10b of the bridging portion C10. The first void X1 is located at a position facing the bottom portion A11b of the substrate A10.

Each second void X2 is generally defined by the bridging portion C10 and the semiconductor layer D10. More specifically, the second void X2 is defined by a portion of the protrusion A11a of the substrate A10, the leg portion C10a of the bridging portion C10, and the second site D11b of the semiconductor layer D10. In other words, the second void X2 is defined by a portion of the sloped portion B10a of the buffer layer B10, the leg portion C10a of the bridging portion C10, and the second site D11b of the semiconductor layer D10. The second void X2 is located at a position facing the protrusion A11a of the substrate A10.

The first void X1 is separated from the second void X2 by means of the leg portion C10a of the bridging portion C10. The leg portion C10a of the bridging portion C10 has the through holes C11a. Thus, the first void X1 communicates with the second void X2 via the through holes C11a.

As shown in FIG. 2, the height H1 of the first void X1 in a direction perpendicular to the main surface of the substrate A10 is greater than the height H2 of the protrusion A11a in a direction perpendicular to the main surface of the substrate A10. Thus, the distance between the top of each of the bridging portions C10 and the bottom portion A11b of the substrate A10 is greater than the distance between the top of each of the protrusions A11a of the substrate A10 and the bottom portion A11b of the substrate A10.

3. Production Method for Semiconductor Structure

3-1. Step of Providing Substrate

Figure 3:
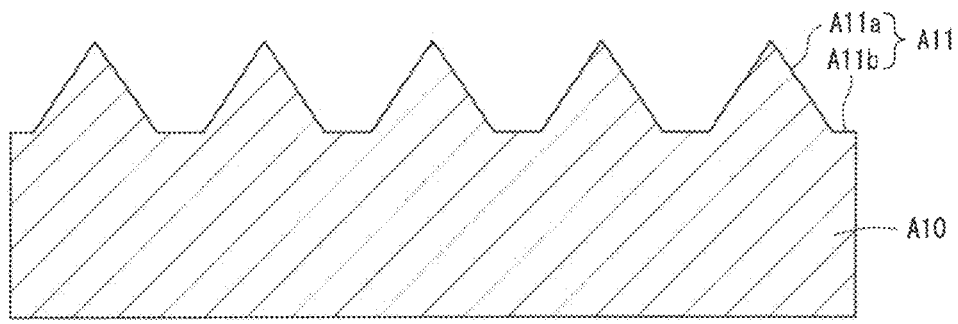
FIG. 3 illustrates a production method for the semiconductor structure of the first embodiment (part 1)

Firstly, the substrate A10 is provided as shown in FIG. 3. As described above, the substrate A10 has the unevenly shaped portion A11. The unevenly shaped portion A11 of the substrate A10 has a plurality of protrusions A11a and a bottom portion A11b. The protrusions A11a have a conical shape. The protrusions A11a are arranged in a honeycomb pattern on the main surface of the substrate A10. The unevenly shaped portion A11 may be formed through etching of the substrate. Alternatively, the substrate A10 having the unevenly shaped portion A11 may be provided.

3-2. Step of Forming Buffer Layer

Figure 4:
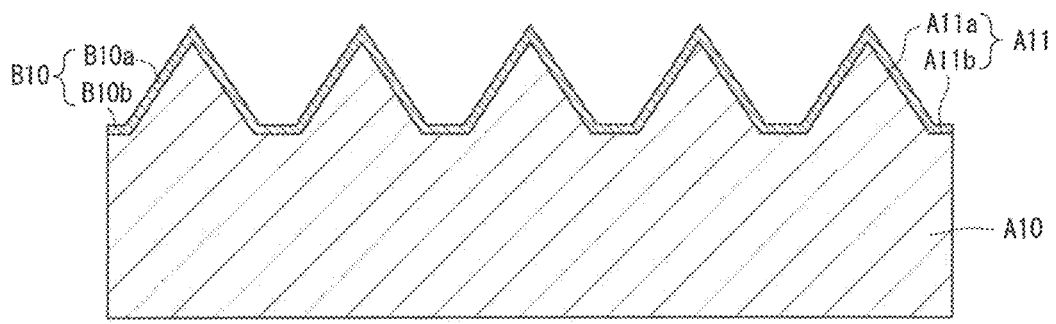
FIG. 4 illustrates the production method for the semiconductor structure of the first embodiment (part 2)

Subsequently, as shown in FIG. 4, the buffer layer B10 is formed on the substrate A10 by means of, for example, MOCVD. The buffer layer B10 has a thickness considerably smaller than the height of the unevenly shaped portion of the substrate A10. Thus, the buffer layer B10 is formed so as to follow the shape of the unevenly shaped portion of the substrate A10. The buffer layer B10 having the sloped portions B10a and the bottom portion B10b is thereby formed. The buffer layer B10 is formed of AlN.

3-3. Step of Forming Decomposition Layer

Figure 5:
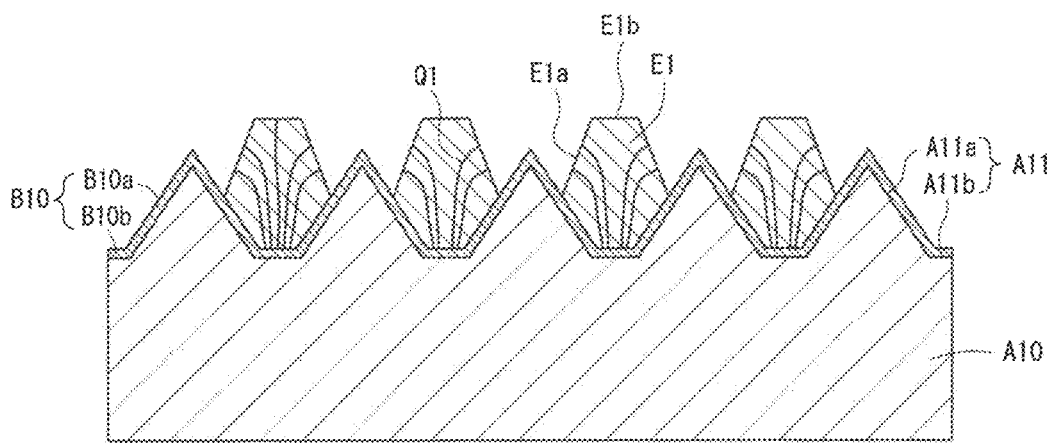
FIG. 5 illustrates the production method for the semiconductor structure of the first embodiment (part 3)

As shown in FIG. 5, decomposition layers E1 are formed on the substrate A10. More specifically, the decomposition layers E1 are formed on the bottom portion B10b and the sloped portions B10a of the buffer layer B10 provided on the unevenly shaped portion A11. InGaN layers are formed as the decomposition layers E1 by means of MOCVD. The InGaN layers are thermally decomposed at a relatively low temperature. The thus-formed decomposition layers E1, which are semiconductor layers, are removed through an etching step described below.

Each decomposition layer E1 is grown generally in the vertical direction at an initial stage of growth, and the decomposition layer E1 is grown generally in the horizontal direction at a later stage of growth. Thus, many threading dislocations Q1 extend in an oblique direction. Specifically, many threading dislocations Q1 extend toward a sloped face E1a rather than a top face E1b. Each decomposition layer E1 is grown from the bottom portion B10b of the buffer layer B10 provided on the substrate A10. Consequently, the decomposition layer E1 is formed on the bottom portion A11b of the substrate A10 and a portion of the adjacent protrusions A11a. Thus, the decomposition layer E1 are grown while extending the threading dislocations Q1.

The thermal decomposition temperature of the decomposition layers E1 is lower than that of the bridging portions C10. The growth temperature of the decomposition layers E1 is 750° C. to 1,150° C., preferably 900° C. to 1,150° C., more preferably 1,000° C. to 1,120° C.

3-4. Step of Forming Bridging Portion

Figure 6:
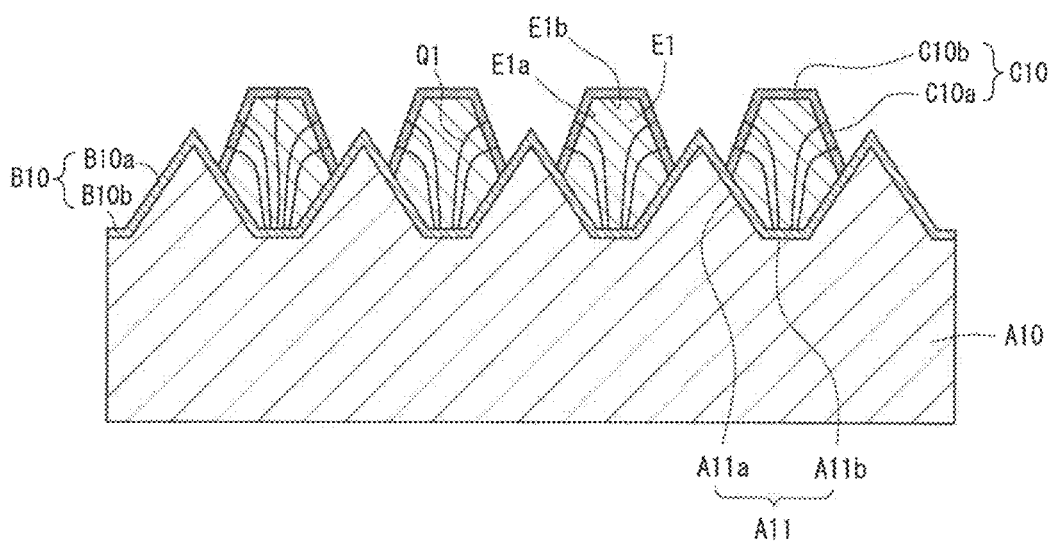
FIG. 6 illustrates the production method for the semiconductor structure of the first embodiment (part 4)

Subsequently, as shown in FIG. 6, the bridging portions C10 each having the leg portion C10a and the top portion C10b are formed on the decomposition layers E1. The bridging portions C10 may be formed by means of MOCVD. Alternatively, the bridging portions C10 may be formed by means of sputtering. As described above, the bridging portions C10 are formed of AlN. The bridging portions C10 are formed so as to cover the decomposition layers E1. The threading dislocations Q1 extend toward the leg portions C10a of the bridging portions C10. The threading dislocations Q1 are then exposed to the surfaces of the bridging portions C10.

3-5. Etching Step (Decomposition Step)

Figure 7:
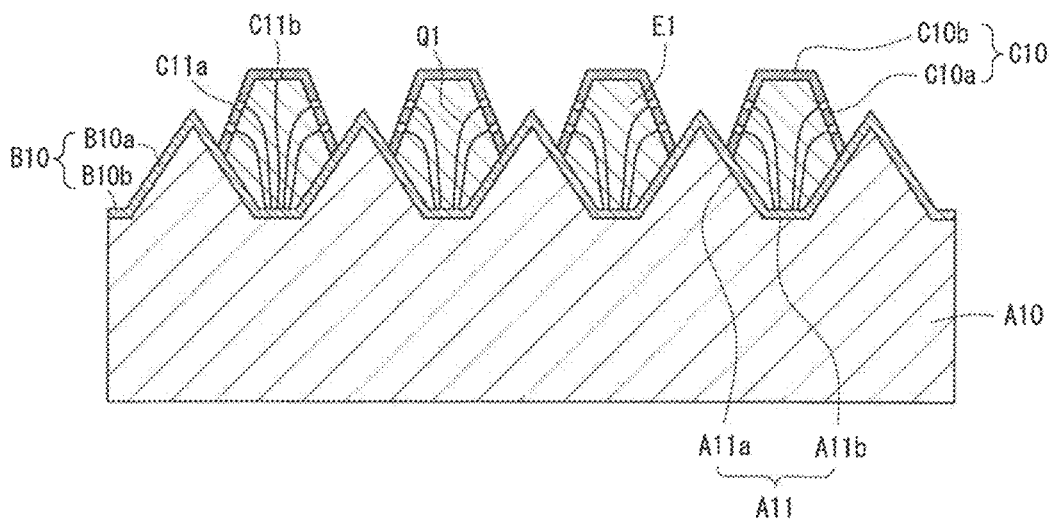
FIG. 7 illustrates the production method for the semiconductor structure of the first embodiment (part 5)

Subsequently, as shown in FIG. 7, the decomposition layers E1 are etched. A gas mixture containing $H_2$ gas and at least one of $N_2$ gas and $NH_3$ gas is supplied for the etching. The substrate temperature is adjusted to a temperature equal to or higher than the thermal decomposition temperature of the decomposition layers E1 and lower than the thermal decomposition temperature of the bridging portions C10. The threading dislocations Q1 are lattice defects due to breakage of interatomic bonds. Accordingly, the decomposition of the semiconductor is likely to occur from the threading dislocations Q1. Thus, even if the semiconductor material has high thermal decomposition temperature, the decomposition of the semiconductor occurs from the threading dislocations Q1. Therefore, the surfaces of the bridging portions C10 are etched from the threading dislocations Q1. Consequently, through holes C11a are provided in the leg portions C10a of the bridging portions C10, and through holes C11b are provided in the top portions C10b of the bridging portions C10. The gas mixture widens the threading dislocations Q1 exposed to the surfaces of the bridging portions C10, to thereby provide the through holes C11a and C11b penetrating the bridging portions C10. Thus, the decomposition layers E1 are exposed in the interior of the through holes C11a and C11b.

Figure 8:
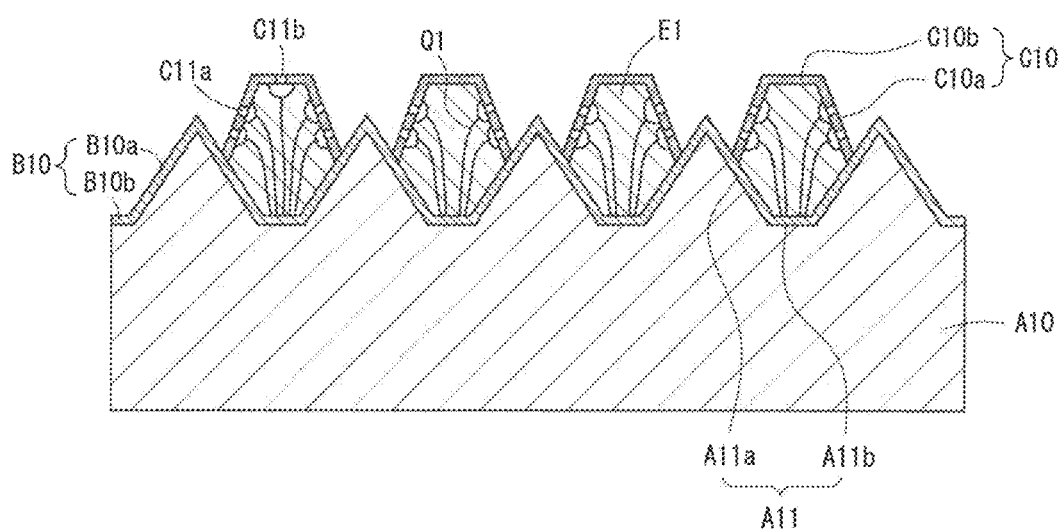
FIG. 8 illustrates the production method for the semiconductor structure of the first embodiment (part 6)

As shown in FIG. 8, the gas mixture decomposes the decomposition layers E1 exposed in the interior of the through holes C11a and C11b. The decomposition layers E1 are thermally decomposed and etched by means of $H_2$ gas. Decomposition products generated through decomposition of the decomposition layers E1 are discharged via the through holes C11a and C11b to the outside of the bridging portions C10.

Figure 9:
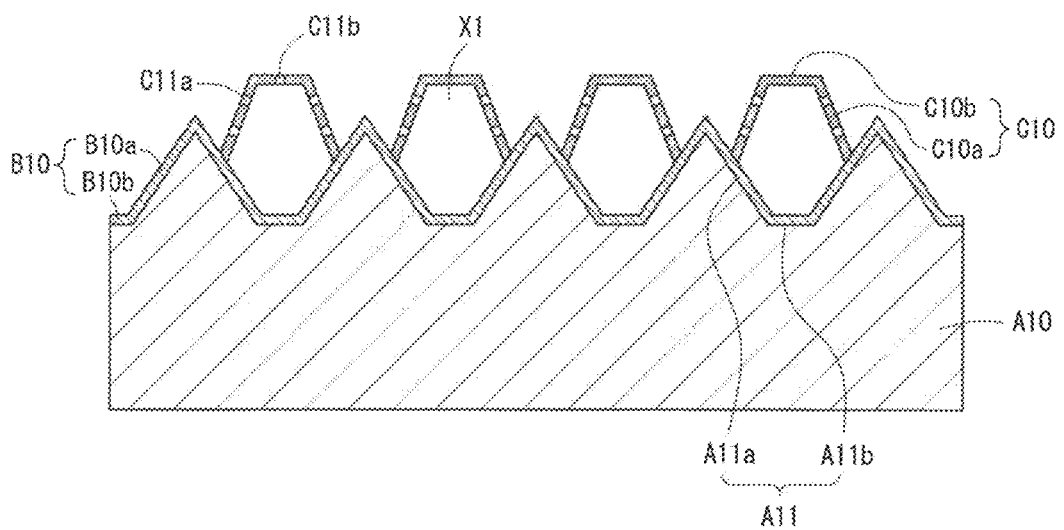
FIG. 9 illustrates the production method for the semiconductor structure of the first embodiment (part 7)

As shown in FIG. 9, the decomposition layers E1 are then etched. Since the bridging portions C10 are not thermally decomposed, the bridging portions C10, which have the through holes C11a and C11b, remain after the etching. Thus, the first voids X1 are provided in regions where the decomposition layers E1 have remained. Each of the first voids X1 is defined by the substrate A10 and the bridging portion C10.

Since the threading dislocations Q1 are concentrated on the sloped faces E1a of the decomposition layers E1, the density of the through holes C11a of the leg portions C10a is higher than that of the through holes C11b of the top portions C10b.

$H_2$ gas contained in the gas mixture generally etches the decomposition layers E1. Thus, the partial pressure of $H_2$ gas is preferably increased. However, the supply of $H_2$ gas alone may cause leaching of Ga metal in the form of droplets. Therefore, $N_2$ gas or $NH_3$ gas is preferably supplied in addition to $H_2$ gas.

Preferably, the gas supplied in the etching step does not contain oxygen. Oxygen oxidizes AlN on the surfaces of the bridging portions C10 to thereby form AlON. The presence of AlON probably causes inversion of the polarity of a semiconductor layer above the bridging portions C10. Thus, the formation of AlON on the surfaces of the bridging portions C10 generates a polarity-inverted site and a non-polarity-inverted site in the semiconductor layer D10. Accordingly, the semiconductor layer D10 formed above the bridging portions C10 exhibits poor crystallinity. Thus, preferably, the gas supplied in the etching step does not contain oxygen. In the case where the substrate A10 contains oxygen atoms, oxygen atoms may remain in the reaction furnace. The remaining oxygen atoms may react with AlN on the surfaces of the bridging portions C10 to thereby form AlON. Thus, preferably, the etching step is immediately followed by the subsequent step for preventing the formation of AlON.

3-6. Step of Forming Semiconductor Layer

Subsequently, the semiconductor layer D10 is grown on the bridging portions C10. The semiconductor layer D10 is grown from the top portions C10b of the bridging portions C10. Thus, the semiconductor layer D10 appropriately fills the through holes C11b of the top portions C10b; i.e., the through holes C11b provided in the top portions C10b are blocked. The threading dislocations Q1 extending toward the leg portions C10a are barely transferred to the semiconductor layer D10.

The semiconductor layer is slightly grown from the leg portions C10a of the bridging portions C10. In some cases, the semiconductor layer D10 may be grown on regions of the leg portions C10a adjacent to the top portions C10b. Thus, the semiconductor layer D10 may block only a small number of the through holes C11a of the leg portions C10a. However, the semiconductor layer D10 does not block all the through holes C11a of the leg portions C10a; i.e., at least some of the through holes C11a provided in the leg portions C10a are not blocked with the semiconductor layer D10.

The second voids X2 are provided in association with the growth of the semiconductor layer D10. Each of the second voids X2 is defined by the leg portion C10a of the bridging portion C10, a top portion of the substrate A10, and the semiconductor layer D10. The semiconductor structure S1 is produced through the above-described steps.

4. Effects of Bridging Portion

The semiconductor structure S1 of the first embodiment has the first voids X1 between the bridging portions C10 and the substrate A10. Needless to say, the bridging portions C10 are not in contact with the substrate A10 at the first voids X1. Accordingly, no interface is present between the bridging portions C10 and the substrate A10 at the first voids X1. That is, no lattice mismatch occurs at the first voids X1. Thus, the bridging portions C10 may undergo a slight strain at positions where they are in contact with the substrate A10. However, the stress applied from the substrate A10 to the bridging portions C10 is considerably reduced as compared with the case of a conventional semiconductor structure. Even if the thickness of the semiconductor layer D10 is increased, the stress from the substrate A10 is reduced. Therefore, the resultant semiconductor layer D10 exhibits excellent crystallinity.

In the semiconductor structure S1 of the first embodiment, many threading dislocations Q1 extend toward the leg portions C10a of the bridging portions C10, and only a few threading dislocations Q1 extend toward the top portions C10b of the bridging portions C10. The semiconductor layer D10 is grown from the top portions C10b of the bridging portions C10. Accordingly, the threading dislocations generated in the layers below the bridging portions C10 are barely transferred to the semiconductor layer D10. Thus, the semiconductor layer D10 has a very low threading dislocation density. That is, the semiconductor layer D10 exhibits excellent crystallinity.

5. Modifications

5-1. Material of Bridging Portion

In the first embodiment, the bridging portions C10 are composed of an AlN layer formed at a high temperature. The thermal decomposition temperature of the bridging portions C10 is higher than that of the decomposition layers E1. The bridging portions C10 may be composed of an AlN layer formed at a low temperature. The bridging portions C10 may be composed of an AlGaN layer or an AlGaInN layer. The bridging portions C10 preferably contain an Al-containing Group III nitride. The bridging portions C10 may be formed of GaN or InGaN, which depends on the material for the decomposition layers E1.

5-2. Angle Between Top Portion and Leg Portion of Bridging Portion

The angle θ1 between the leg portion C10a and top portion C10b of each bridging portion C10 is 10° to 90°. The angle θ1 may be 0° to 90°. In the case where the angle θ1 is 0°, the leg portion C10a is not distinguished from the top portion C10b.

5-3. Area of Top Portion of Bridging Portion

The area of the top portions C10b of the bridging portions C10 that are in contact with the semiconductor layer D10 is preferably smaller than a half of the area of the main surface of the substrate A10. In such a case, the threading dislocations generated in the layers below the bridging portions C10 are less likely to propagate to the semiconductor layer D10. As used herein, the "main surface" of the substrate A10 refers to the surface of the substrate A10 on which the bridging portions C10 are bridged.

5-4. Absence of Top Portion of Bridging Portion

Bridging portions having no top portions C10b may be formed. In such a case, the semiconductor layer is grown from a portion around the top of the leg portion.

5-5. Thickness of Leg Portion and Top Portion of Bridging Portion

The thickness of the top portion C10b of each bridging portion C10 is preferably greater than that of the leg portion C10a of the bridging portion C10. In such a case, the semiconductor layer D10 having high crystallinity is likely to be grown from the top portions C10b.

5-6. One Body Bridging Portion

In the first embodiment, there are a plurality of bridging portions C10. Bridging portion C10 may be an integral layer (one body layer).

5-7. Bridging Portion Having Multilayer Structure

In the first embodiment, each bridging portion C10 is formed of a single AlN layer. The bridging portion C10 may have a multilayer structure. Alternatively, the bridging portion C10 may have a superlattice structure; for example, a superlattice structure formed of an AlN layer and a GaN layer. Preferably, the entire bridging portion C10 does not have an excessively large thickness.

5-8. Facet Plane of Bridging Portion

The surface of the leg portion C10a of each bridging portion C10 may be a facet plane; for example, (10-1X) plane or (11-2X) plane. The surface of the top portion C10b of the bridging portion C10 may also be a facet plane; for example, (0001) plane. In such a case, the bridging portion C10 has a stable form.

5-9. Crack of Bridging Portion

The bridging portions C10 are preferably formed of a material similar to that used for the semiconductor layer D10. The use of such a similar material can prevent a reduction in crystal quality and an increase in strain, which are caused by lattice constant difference. Cracks may be intentionally generated in the bridging portions C10. In such a case, each bridging portion C10 has at least one crack, and the strain of the semiconductor layer D10 is further reduced. In the case where no cracks are generated, defects are reduced in the semiconductor layer D10. In this case, the semiconductor layer D10 exhibits high crystal quality. The through holes C11a and C11b are generated through etching from the threading dislocations Q1. Meanwhile, cracks are generated by a stress from the substrate A10 or a thermal stress during cooling.

5-10. Material of Decomposition Layer

In the first embodiment, each decomposition layer E1 is an InGaN layer. The decomposition layer E1 may be a GaN layer. The decomposition layer E1 may be doped with Si or Mg. In particular, Si promotes a three-dimensional growth mode (anti-surfactant effect). Thus, the decomposition layer E1 is preferably doped with Si. Needless to say, the decomposition layer E1 preferably has a low thermal decomposition temperature. Hence, the decomposition layer E1 preferably contains In. The incorporation of Al tends to increase the thermal decomposition temperature. In the case where the decomposition layer E1 contains Al, the Al content of the decomposition layer E1 is preferably lower than that of the bridging portions C10. The decomposition layer E1 may be formed of BN or a material other than a Group III nitride (e.g., TiN or SiNx), so long as the decomposition layer E1 has a thermal decomposition temperature lower than that of the bridging portions C10. The decomposition layer E1 is preferably formed of a Group III nitride semiconductor having a composition similar to that of the semiconductor layer formed later. The use of such a Group III nitride semiconductor can prevent the intrusion of impurities into the later-formed semiconductor layer. Thus, the decomposition layer E1 is preferably formed of InGaN.

5-11. Material of Buffer Layer

In the first embodiment, the buffer layer B10 is formed of AlN. The AlN layer includes a low-temperature buffer layer and a high-temperature buffer layer. The buffer layer B10 may be formed of (in place of AlN) a low-temperature GaN buffer layer, a BN layer, a TiN layer, an SiNx layer, or a mixture thereof.

5-12. Step of Separating Substrate (Production Method for Semiconductor Single-Crystal Substrate)

The semiconductor layer D10 may be a semiconductor single-crystal substrate; for example, a GaN substrate. In such a case, the substrate A10 is separated from the semiconductor layer D10. For example, the first voids X1 are present between the substrate A10 and the semiconductor layer D10. The bridging portions C10 exhibit a relatively low mechanical strength. Thus, the substrate A10 can be readily separated from the semiconductor layer D10. During the separation, the bridging portions C10 may remain on the semiconductor layer D10 or the substrate A10. The breakage of the bridging portions C10 may cause separation of the semiconductor layer D10 and the substrate A10. Thus, the semiconductor single-crystal substrate is produced.

5-13. Unevenly Shaped Portion of Substrate

In the first embodiment, the substrate A10 has a plurality of protrusions A11a and a bottom portion A11b. The protrusions A11a have a conical shape. The protrusions A11a may have a truncated conical shape, a polygonal conical shape, or a truncated polygonal conical shape. In such a case, the unevenly shaped portion of substrate A10 has a bottom portion and a plurality of protrusions extending from the bottom portion. The substrate may have dents instead of the protrusions A11a.

Figure 10:
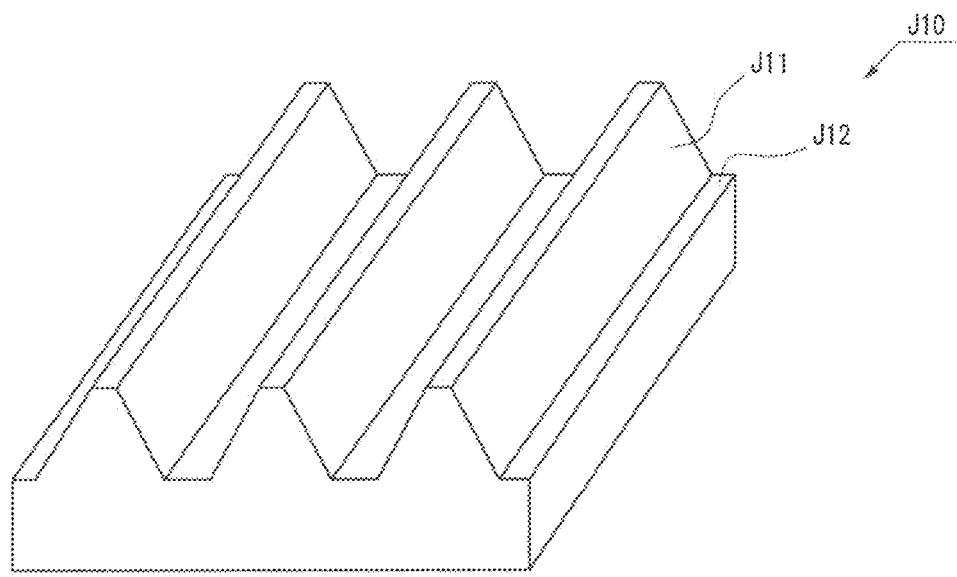
FIG. 10 is a perspective view of a substrate of a semiconductor structure according to a modification of the first embodiment.

FIG. 10 is a perspective view of a substrate J10 of a light-emitting device according to a modification of the first embodiment. As shown in FIG. 10, the substrate J10 having a stripe-pattern unevenly shaped portion may be used. The substrate J10 has ridge-shaped protrusions J11 and a bottom portion J12. Thus, the technique of the first embodiment is applicable to another uneven substrate. The uneven substrate may have a non-periodic structure.

5-14. Decomposition Step (Etching Step)

The etching step involves supply of a gas mixture of $H_2$ gas and at least one of $N_2$ gas and $NH_3$ gas. However, $H_2$ gas is not necessarily supplied. In such a case, the decomposition layers E1 are not etched by $H_2$ gas, but are only thermally decomposed. In such a case, the decomposition layers E1 can be removed if the bridging portions C10 have a sufficiently small thickness.

5-15. Residue

In the first embodiment, the decomposition layers E1 are removed through etching. However, a portion of the decomposition layers E1 may remain as a residue in the semiconductor structure S1. In such a case, the residue remains in the first voids X1. The residue contains, for example, InGaN or GaN.

5-16. Layered Structure of Semiconductor Layer

In the first embodiment, the semiconductor layer D10 is composed of one or more semiconductor layers. The semiconductor layer D10 may have any layered structure.

5-17. Semiconductor Device

Electrodes may be provided on the semiconductor layer D10 of the first embodiment, to thereby produce a semiconductor device.

5-18. Combination

The above-described modifications may be used in any combination.

6. Summary of First Embodiment

As described above in detail, the semiconductor structure S1 of the first embodiment includes the substrate A10, the bridging portions C10, the semiconductor layer D10, and the first voids X1 provided between the substrate A10 and the bridging portions C10. The threading dislocations Q1 extend from the decompositions layer E1 toward the leg portions C10a of the bridging portions C10. The semiconductor layer D10 is grown from the top portions C10b of the bridging portions C10. Accordingly, the threading dislocations Q1 are barely transferred to the semiconductor layer D10. Thus, the semiconductor layer D10 included in the semiconductor structure S1 exhibits excellent crystallinity.

The above-described embodiment is merely an example. Thus, needless to say, various modifications and variations may be made without departing from the scope of the embodiment. For example, the semiconductor layer is not necessarily grown through metal-organic chemical vapor deposition (MOCVD), and may be grown by any other crystal growth method using a carrier gas. Alternatively, the semiconductor layer may be formed by another epitaxial growth method, such as liquid-phase epitaxy or molecular beam epitaxy.

Second Embodiment

1. Semiconductor Light-Emitting Device

Figure 11:
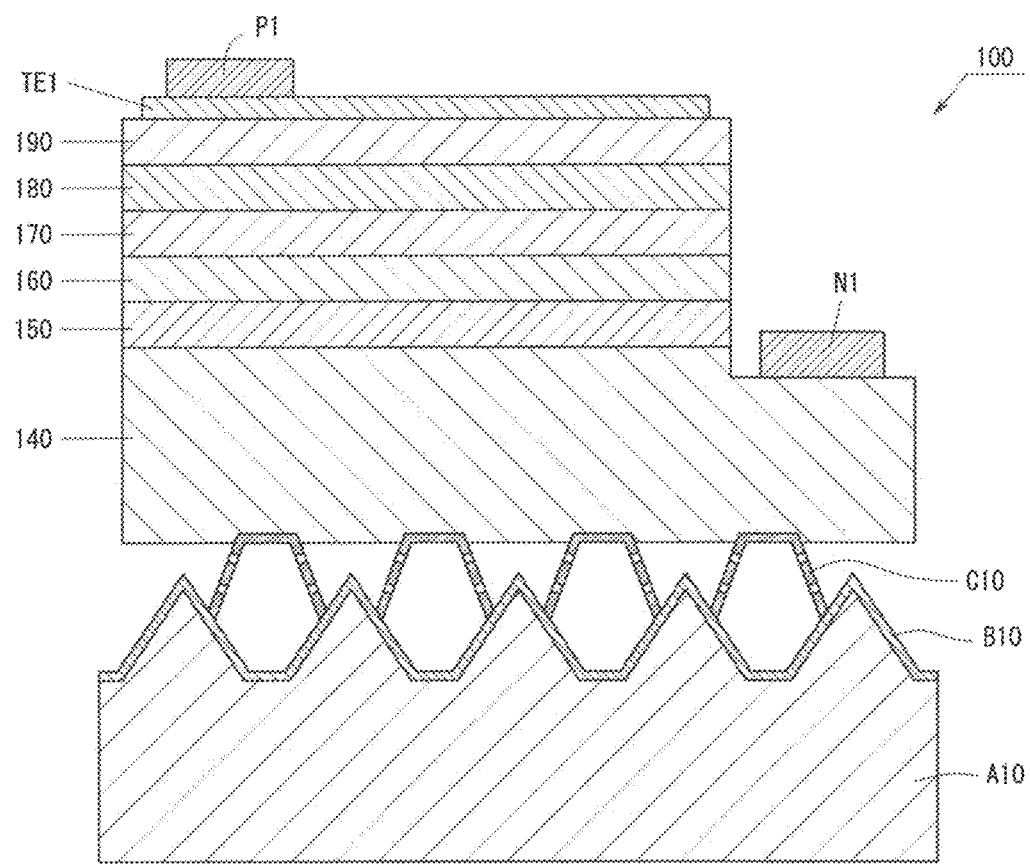
FIG. 11 schematically shows the configuration of a light-emitting device of a second embodiment.

FIG. 11 schematically shows the configuration of a light-emitting device 100 of the second embodiment. The light-emitting device 100 is an example of the semiconductor structure S1 of the first embodiment. As shown in FIG. 11, the light-emitting device 100 is a face-up type semiconductor light-emitting device. The light-emitting device 100 includes a plurality of Group III nitride semiconductor layers. Needless to say, the light-emitting device 100 is a type of semiconductor device.

As shown in FIG. 11, the light-emitting device 100 includes a substrate A10, a buffer layer B10, bridging portions C10, an n-type contact layer 140, an n-side electrostatic breakdown preventing layer 150, an n-side superlattice layer 160, a light-emitting layer 170, a p-side cladding layer 180, a p-type contact layer 190, a transparent electrode TE1, an n-electrode N1, and a p-electrode P1. The n-type contact layer 140, the n-side electrostatic breakdown preventing layer 150, and the n-side superlattice layer 160 are n-type semiconductor layers. In the second embodiment, the n-type semiconductor layer is a first semiconductor layer of a first conductive type. The p-side cladding layer 180 and the p-type contact layer 190 are p-type semiconductor layers. In the second embodiment, the p-type semiconductor layer is a second semiconductor layer of a second conductive type. The n-type semiconductor layer may include, for example, a ud-GaN layer that is not doped with a donor. The p-type semiconductor layer may include, for example, a ud-GaN layer that is not doped with an acceptor.

The substrate A10, the buffer layer B10, and the bridging portions C10 are the same as those in the first embodiment.

The n-type contact layer 140 is provided for achieving ohmic contact with the n-electrode N1. The n-type contact layer 140 is formed on the top portions C10b of the bridging portions C10. The n-electrode N1 is located on the n-type contact layer 140. The n-type contact layer 140 is formed of, for example, n-type GaN.

The n-side electrostatic breakdown preventing layer 150 is provided for preventing the electrostatic breakdown of each semiconductor layer. The n-side electrostatic breakdown preventing layer 150 is formed on the n-type contact layer 140. The n-side electrostatic breakdown preventing layer 150 includes, for example, a ud-GaN (unintentionally doped GaN) layer and an n-type GaN layer. The n-side electrostatic breakdown preventing layer 150 may have a structure other than that described above.

The n-side superlattice layer 160 serves as a strain relaxation layer for relaxing a stress applied to the light-emitting layer 170. More specifically, the n-side superlattice layer 160 is a superlattice layer having a superlattice structure. The n-side superlattice layer 160 is formed on the n-side electrostatic breakdown preventing layer 150. The n-side superlattice layer 160 is formed through, for example, repeated depositing of layer units each including an InGaN layer and a GaN layer. Needless to say, these semiconductor layers may be formed of other materials.

The light-emitting layer 170 emits light through recombination of electrons and holes. The light-emitting layer 170 is formed on the n-side superlattice layer 160. The light-emitting layer 170 is formed through repeated depositing of layer units each including a well layer and a barrier layer. That is, the light-emitting layer 170 has a multiple quantum well structure. The light-emitting layer 170 may include a cap layer formed on the well layer. The light-emitting layer 170 may have a single quantum well structure.

The p-side cladding layer 180 is formed on the light-emitting layer 170. The p-side cladding layer 180 is formed through repeated depositing of layer units each including a p-type InGaN layer and a p-type AlGaN layer. Needless to say, these semiconductor layers may be formed of other materials.

The p-type contact layer 190 is provided for achieving ohmic contact with the transparent electrode TE1. The p-type contact layer 190 is formed on the p-side cladding layer 180.

The transparent electrode TE1 is provided for diffusing current in the light-emitting surface. The transparent electrode TE1 is formed on the p-type contact layer 190. The transparent electrode TE1 is preferably formed of any of ITO, IZO, ICO, ZnO, $TiO_2$, $NbTiO_2$, $TaTiO_2$, and $SnO_2$.

The p-electrode P1 is formed on the transparent electrode TE1. The p-electrode P1 is formed of a combination of one or more of, for example, Ni, Au, Ag, and Co. Needless to say, the p-electrode P1 may be formed of any other material. The p-electrode P1 is conducted to the p-type semiconductor layers.

The n-electrode N1 is formed on the n-type contact layer 140. The n-electrode N1 is formed of a combination of one or more of, for example, Ni, Au, Ag, and Co. Needless to say, the n-electrode N1 may be formed of any other material. The n-electrode N1 is conducted to the n-type semiconductor layers.

The light-emitting device 100 may include a protective film for protecting the semiconductor layers.

2. Effects of Void

Figure 12:
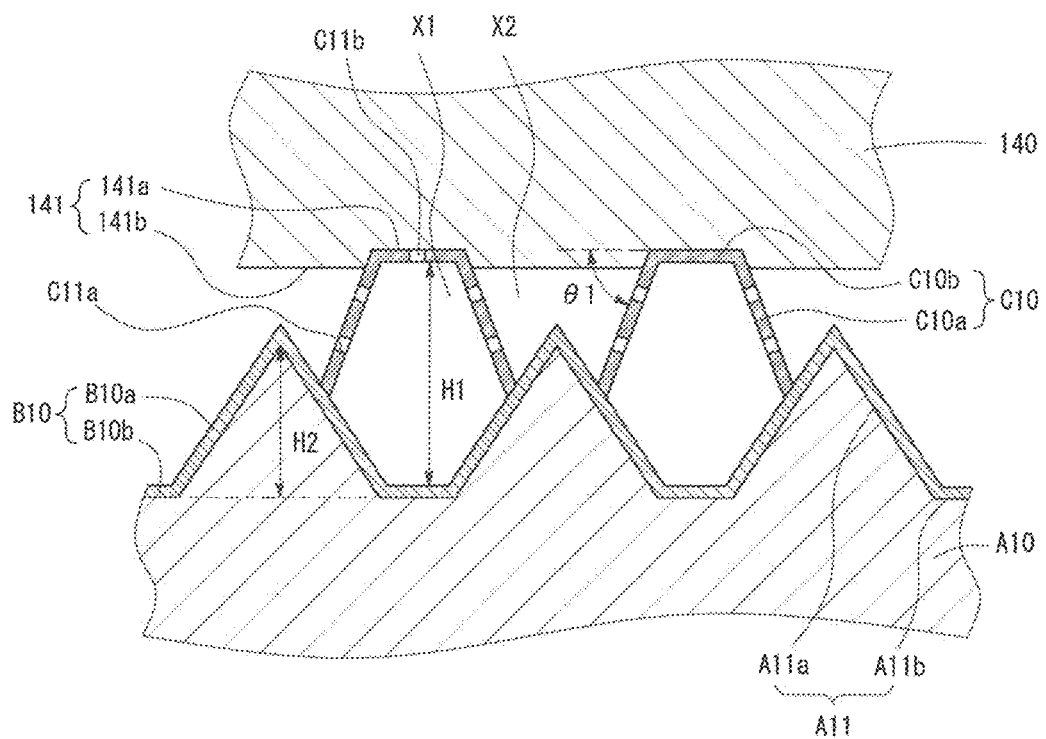
FIG. 12 is an enlarged view of a region around bridging portions in the light-emitting device of the second embodiment.

As shown in FIG. 12, in the second embodiment, the first voids X1 and the second voids X2 are present between the substrate A10 and the n-type contact layer 140. Thus, light emitted from the light-emitting layer 170 toward the substrate A10 is reflected or scattered at the first voids X1 and the second voids X2. The reflection or scattering of light is caused by the difference in refractive index between the semiconductor layer and air. The reflection or scattering of light improves light extraction performance.

3. Production Method for Semiconductor Light-Emitting Device

Now will be described a method for producing the light-emitting device 100 of the second embodiment. The semiconductor light-emitting device of the second embodiment is produced by using the method for producing the bridging portions and voids described in the first embodiment.

The aforementioned respective semiconductor layers are epitaxially grown through metal-organic chemical vapor deposition (MOCVD). The carrier gas used in the method is hydrogen ($H_2$), nitrogen ($N_2$), or a gas mixture of hydrogen and nitrogen ($H_2+N_2$). Ammonia gas ($NH_3$) is used as a nitrogen source. Trimethylgallium ($Ga(CH_3)_3$) is used as a Ga source. Trimethylindium ($In(CH_3)_3$) is used as an In source. Trimethylaluminum ($Al(CH_3)_3$) is used as an Al source. Silane ($SiH_4$) is used as an n-type dopant gas. Bis(cyclopentadienyl)magnesium ($Mg(C_5H_5)_2$) is used as a p-type dopant gas. Gases other than those described above may be used.

3-1. Cleaning of Substrate

The substrate A10 is cleaned with $H_2$ gas. The substrate temperature is adjusted to about 1,100° C. Needless to say, the cleaning may be carried out at another substrate temperature.

3-2. Production of Bridging Portion and Void

The bridging portions C10, the first voids X1, and the second voids X2 are produced by the method for producing the bridging portions and voids described above. Thus, the buffer layer formation step to the etching step in the first embodiment are carried out.

3-3. Step of Forming n-Type Contact Layer

Subsequently, the n-type contact layer 140 is formed on the bridging portions C10. In this case, the n-type contact layer 140 is grown from the top portions C11b of the bridging portions C10. In the case were the n-type contact layer 140 is formed from GaN, the substrate temperature is adjusted to 900° C. to 1,140° C. In the case of growth of InGaN, the substrate temperature is adjusted to 600° C. to 1,000° C. In the case of growth of AlGaN, the substrate temperature is adjusted to 1,000° C. to 1,500° C.

3-4. Step of Forming n-Side Electrostatic Breakdown Preventing Layer

Thereafter, the n-side electrostatic breakdown preventing layer 150 is formed on the n-type contact layer 140. The ud-GaN layer and the n-type GaN layer are formed in this order. In this step, the substrate temperature may be the same as that in the n-type contact layer formation step. The substrate temperature may be lowered during formation of the n-side electrostatic breakdown preventing layer 150 for facilitating formation of pits. The formation of pits can improve electrostatic breakdown preventing performance and yield.

3-5. Step of Forming n-Side Superlattice Layer

Subsequently, the n-side superlattice layer 160 is formed on the n-side electrostatic breakdown preventing layer 150. The n-side superlattice layer 160 is formed through repeated depositing of layer units each including an InGaN layer and a GaN layer.

3-6. Step of Forming Light-Emitting Layer

Thereafter, the light-emitting layer 170 is formed on the n-side superlattice layer 160. The light-emitting layer 170 is formed through repeated depositing of layer units each including a well layer and a barrier layer. A cap layer may be formed after formation of the well layer.

3-7. Step of Forming p-Side Cladding Layer

Subsequently, the p-side cladding layer 180 is formed on the light-emitting layer 170. In this step, p-type InGaN layers and p-type AlGaN layers are repeatedly deposited.

3-8. Step of Forming p-Type Contact Layer

Thereafter, the p-type contact layer 190 is formed on the p-side cladding layer 180.

3-9. Step of Forming Transparent Electrode

Subsequently, the transparent electrode TE1 is formed on the p-type contact layer 190

3-10. Electrode Formation Step

Thereafter, the p-electrode P1 is formed on the transparent electrode TE1. Laser processing or etching is then carried out from the top surface of the p-type contact layer 190, to thereby expose a portion of the n-type contact layer 140 through the corresponding portions of the semiconductor layers. The n-electrode N1 is formed on the exposed portion of the n-type contact layer 140. The p-electrode P1 formation step may be preceded or followed by the n-electrode N1 formation step.

3-11. Other Steps

In addition to the above-described steps, other steps (including a thermal treatment step and an insulation film formation step) may be carried out. Thus, the light-emitting device 100 shown in FIG. 11 is produced.

4. Modifications 4-1. Flip-Chip

The technique of the second embodiment is applicable to a flip-chip type semiconductor light-emitting device.

4-2. N-Type Contact Layer

The composition of the n-type contact layer 140 is constant therein. However, the composition may be gradually varied in the n-type contact layer 140. An AlN layer, an AlGaN layer, an InGaN layer, or an AlGaInN layer may further be formed between the n-type contact layer 140 and the bridging portions C10. These layers may be doped with Si.

4-3. Layered Structure of Semiconductor Layer

In the second embodiment, the n-type contact layer 140, the n-side electrostatic breakdown preventing layer 150, the n-side superlattice layer 160, the light-emitting layer 170, the p-side cladding layer 180, and the p-type contact layer 190 are sequentially formed on the bridging portions C10. Needless to say, the light-emitting device may have any other layered structure. Each of the aforementioned layers may have a structure other than that described in the second embodiment.

4-4. Combination

The above-described modifications may be used in any combination. These modifications may be used in any combination with the first embodiment and its modifications.

5. Summary of Second Embodiment

As described above in detail, the light-emitting device 100 of the second embodiment includes the bridging portions C10, the first voids X1, and the second voids X2 between the uneven substrate A10 and the n-type semiconductor layer. Since the voids are present between the substrate A10 and the semiconductor layer, light emitted from the light-emitting layer 170 is sufficiently scattered. Thus, the light-emitting device 100 exhibits high light extraction performance. As in the case of the first embodiment, the semiconductor layers formed above the n-type contact layer 140 exhibit good crystallinity, since the bridge structure of the bridging portions C10 reduces the stress between the substrate and the semiconductor layers.

The above-described embodiment is merely an example. Thus, needless to say, various modifications and variations may be made without departing from the scope of the disclosure. For example, the semiconductor layer is not necessarily grown through metal-organic chemical vapor deposition (MOCVD), and may be grown by any other crystal growth method using a carrier gas. Alternatively, the semiconductor layer may be formed by another epitaxial growth method, such as liquid-phase epitaxy or molecular beam epitaxy.

Third Embodiment

The third embodiment will now be described. The third embodiment involves the use of a substrate having truncated conical protrusions. Thus, the third embodiment will be described by focusing on the difference from the first embodiment.

1. Semiconductor Structure

Figure 13:
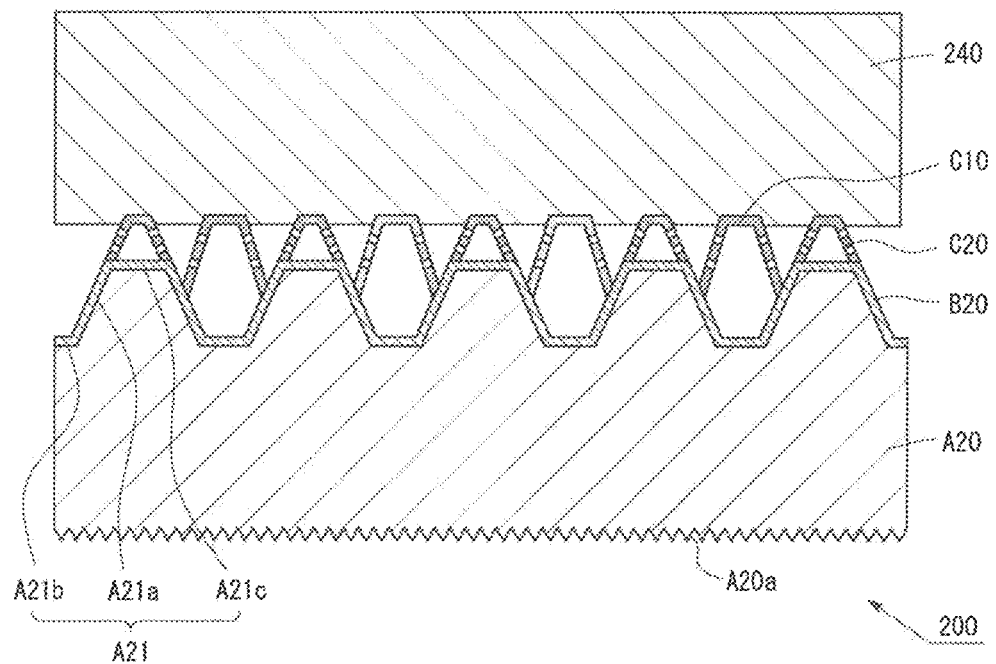
FIG. 13 schematically shows the configuration of a semiconductor structure of a third embodiment.

FIG. 13 schematically shows the configuration of a semiconductor structure 200 of the third embodiment. The semiconductor structure 200 includes a substrate A20, a buffer layer B20, bridging portions C10 and C20, and a semiconductor layer 240.

The substrate A20 has an unevenly shaped portion A21. The unevenly shaped portion A21 has sloped faces A21a, bottom faces A21b, and top faces A21c. The bridging portions C10 are supported by the sloped faces A21a of the substrate A20.

The bridging portions C20 are supported by the top faces A21c of the substrate A20. Thus, the bridging portions C20 may be grown from the top faces A21c of the unevenly shaped portion A21 of the substrate A20.

2. Modifications

The semiconductor structure may include bridging portions grown from the bottom faces A21b of the substrate A20. In such a case, the bridging portions are supported by the bottom faces A21b of the substrate A20.

Fourth Embodiment

The fourth embodiment will now be described. The fourth embodiment involves the use of an uneven substrate on which a semiconductor layer having a non-polar or semi-polar flat surface is grown. Thus, the fourth embodiment will be described by focusing on the difference from the first embodiment.

1. Semiconductor Structure

Figure 14:
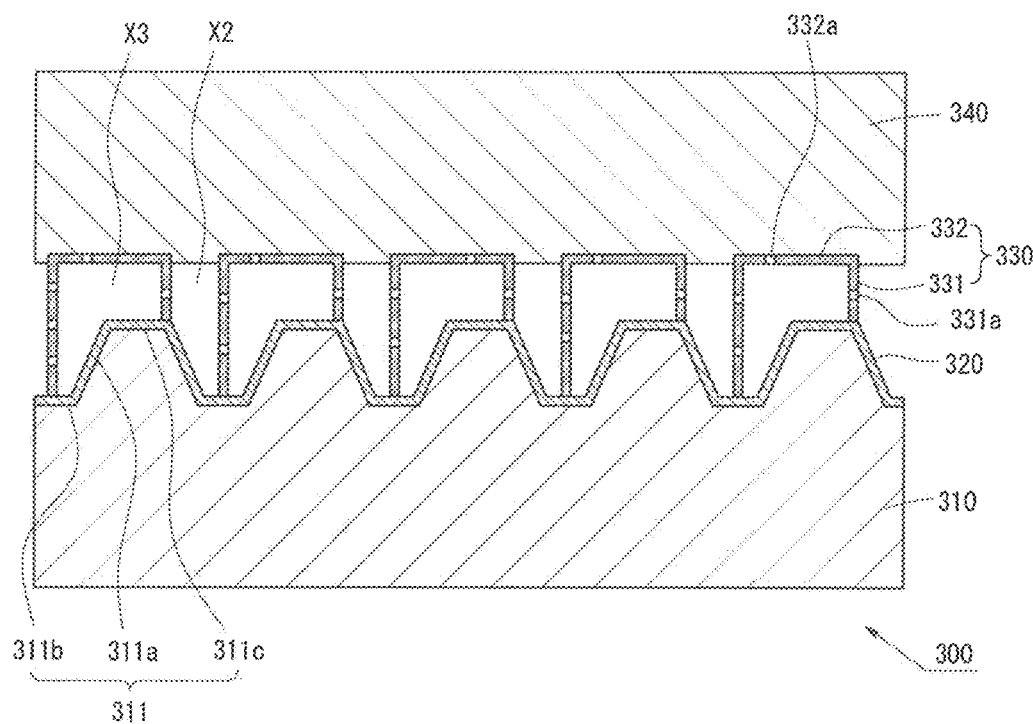
FIG. 14 schematically shows the configuration of a semiconductor structure of a fourth embodiment.

FIG. 14 schematically shows the configuration of a semiconductor structure 300 of the fourth embodiment. The semiconductor structure 300 includes a substrate 310, a buffer layer 320, bridging portions 330, and a semiconductor layer 340.

In the fourth embodiment, the substrate 310 has an unevenly shaped portion 311. The substrate 310 has sloped portions 311a, bottom portions 311b, and top portions 311c. The bottom portions 311b and the top portions 311c are mutually parallel flat surfaces. The sloped portions 311 are side portions of the unevenly shaped portion 311. The buffer layer 320 is formed along the unevenly shaped portion of the substrate 310.

The bridging portions 330 are formed on the bottom portions 311b and the top portions 311c of the substrate 310. Each bridging portion 330 has a leg portion 331 and a top portion 332. The top portion 332 is a non-polar or semi-polar surface. The leg portion 331 is inclined by about 90° relative to the top portion 332.

Each bridging portion 330 is formed to cover the bottom portion 311b of the substrate 310 and the top portion 311c of the substrate 310.

The semiconductor layer 340 is grown generally from the top portions 332 of the bridging portions 330.

2. Void

The semiconductor structure 300 has voids X3. The voids X3 are first voids. The voids X3 are located between the unevenly shaped portion 311 of the substrate 310 and the semiconductor layer 340. The voids X3 are defined by the unevenly shaped portion 311 of the substrate 310 and the bridging portions 330. In other words, the voids X3 are defined by the buffer layer 320 and the bridging portions 330.

3. Growth of Decomposition Layer

In the fourth embodiment, the decomposition layer is grown through the technique disclosed in Japanese Patent Application Laid-Open (kokai) No. 2013-241337. Thus, the semiconductor layer is grown as shown in FIG. 1.B of Japanese Patent Application Laid-Open (kokai) No. 2013-241337.

4. Effects of Fourth Embodiment

In the fourth embodiment, the semiconductor layer 340 is grown generally from the top portions 332 of the bridging portions 330. Thus, the semiconductor layer 340 exhibits a relatively low threading dislocation density. That is, the semiconductor layer of the semiconductor structure 300 exhibits high crystallinity.

In the case where the semiconductor structure 300 is a light-emitting device, light emitted from the light-emitting layer is effectively reflected or scattered at the voids X3. Thus, the light-emitting device exhibits high external quantum efficiency. Since the top surface of the light-emitting layer is a non-polar or semi-polar surface, a sufficiently small piezoelectric field is applied to the light-emitting layer. Accordingly, the wave function of holes overlaps well with the wave function of electrons in the light-emitting layer. Thus, the light-emitting device exhibits high internal quantum efficiency as compared with conventional cases.

5. Modifications

The fourth embodiment may use any combination of the first and second embodiments and their modifications.

Fifth Embodiment

The fifth embodiment will now be described. The fifth embodiment involves the use of a substrate having no unevenly shaped portion on its main surface. Thus, the fifth embodiment will be described by focusing on the difference from the first embodiment.

1. Semiconductor Structure

Figure 15:
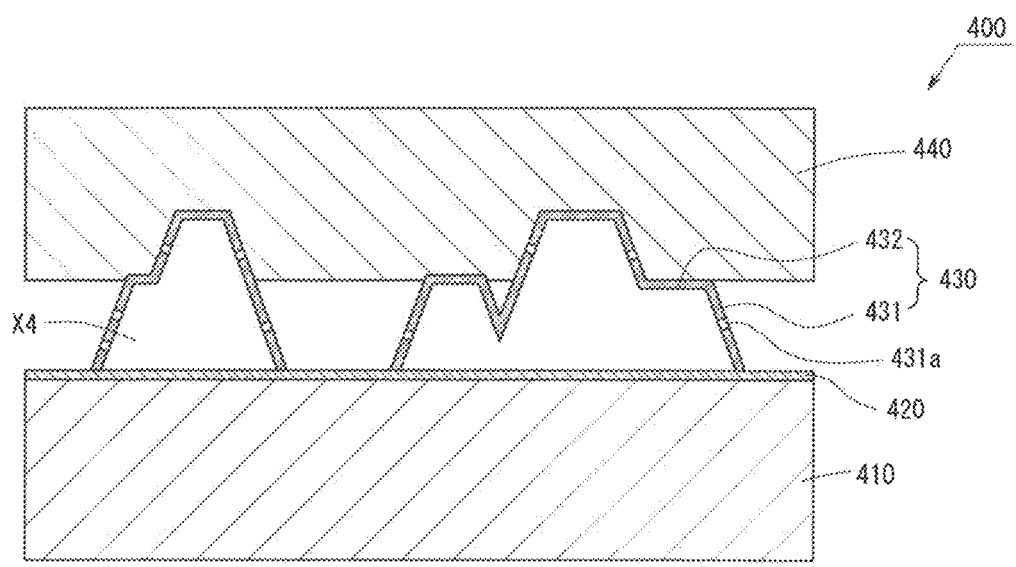
FIG. 15 schematically shows the configuration of a semiconductor structure of a fifth embodiment.

FIG. 15 schematically shows the configuration of a semiconductor structure 400 of the fifth embodiment. The semiconductor structure 400 includes a substrate 410, a buffer layer 420, bridging portions 430, and a semiconductor layer 440.

As shown in FIG. 15, the main surface of the substrate 410 (i.e., the surface on which the semiconductor layer is formed) has no unevenly shaped portion. Thus, the main surface of the substrate 410 is a flat surface; i.e., the substrate 410 has a flat surface. The flat buffer layer 420 is formed on the flat substrate 410.

The bridging portions 430 are grown from the flat surface of the substrate 410. That is, the bridging portions 430 are supported by the main surface of the substrate 410. In other words, the bridging portions 430 are formed on the buffer layer 420. The bridging portions 430 are formed to cover the flat buffer layer 420. Each bridging portion 430 has a leg portion 431 and a top portion 432. The leg portion 431 is grown from the flat buffer layer 420.

The bridging portions 430 are arranged in a non-periodic manner. The bridging portions 430 have uneven heights and widths.

The semiconductor layer 440 is grown generally from the top portions 432 of the bridging portions 430. In some cases, the semiconductor layer 440 may be grown from exposed portions of the buffer layer 420. The semiconductor layer 440 has an unevenly shaped portion corresponding to the bridging portions 430 having uneven heights and widths.

2. Void

The semiconductor structure 400 has voids X4. The voids X4 are first voids. The voids X4 are located between the flat surface of the substrate 410 and the semiconductor layer 440. The voids X4 are defined by the flat surface of the substrate 410 and the bridging portions 430. In other words, the voids X4 are defined by the buffer layer 420 and the bridging portions 430. In the fifth embodiment, the substrate 410 has no unevenly shaped portion, and thus the voids X4 are randomly located on the substrate 410. That is, the bridging portions 430 and the voids X4 are arranged in a non-periodic manner.

3. Production Method for Semiconductor Structure 3-1. Step of Forming Decomposition Layer Decomposition layers E1 are formed on the flat main surface of the substrate 410.

4. Effects of Fifth Embodiment

In the fifth embodiment, the semiconductor layer 440 is grown generally from the top portions 432 of the bridging portions 430. Thus, the semiconductor layer 440 exhibits a relatively low threading dislocation density. That is, the semiconductor layer of the semiconductor structure 400 exhibits high crystallinity.

In the case where the semiconductor structure 400 is a light-emitting device, light emitted from the light-emitting layer is effectively reflected or scattered at the voids X4. Thus, the light-emitting device exhibits high external quantum efficiency.

In the fifth embodiment, in many cases, decomposition layers are discretely formed in an island pattern. Thus, the bridging portions 430 are also discretely arranged in an island pattern.

5. Modifications

The fifth embodiment may use any combination of the first and second embodiments and their modifications.

Sixth Embodiment

The sixth embodiment will now be described.

1. Semiconductor Structure

Figure 16:
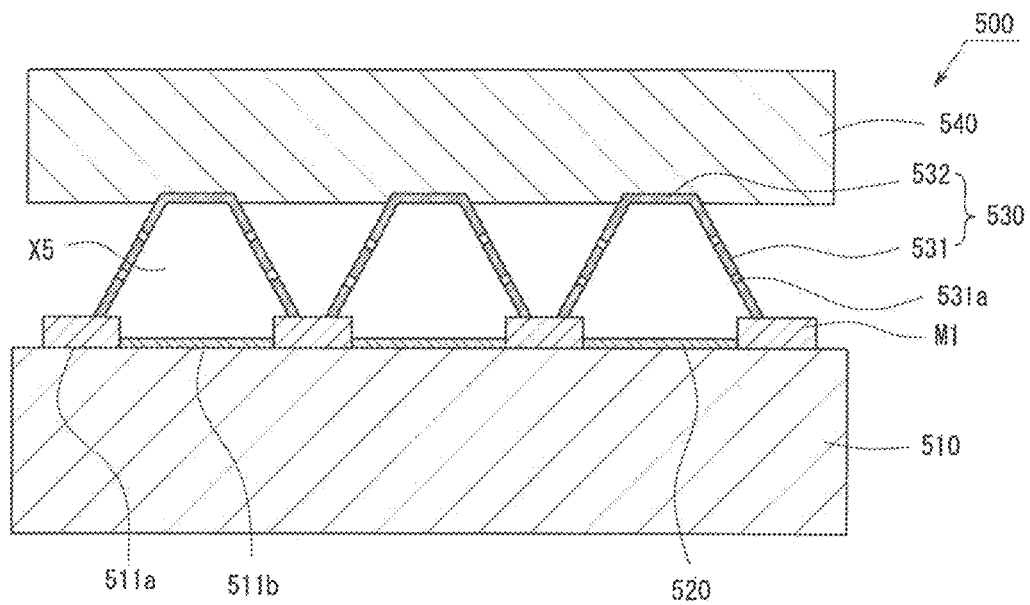
FIG. 16 schematically shows the configuration of a semiconductor structure of a sixth embodiment.

FIG. 16 schematically shows the configuration of a semiconductor structure 500 of the sixth embodiment. The semiconductor structure 500 includes a substrate 510, mask layers M1, a buffer layer 520, a plurality of bridging portions 530, and a semiconductor layer 540.

In the sixth embodiment, the substrate 510 has no unevenly shaped portion on its main surface. The substrate 510 has a flat main surface. The main surface is a first surface. The mask layers M1 are formed on portions 511a of the main surface of the substrate 510. The buffer layer 520 is formed on the remaining portions 511b of the main surface of the substrate 510.

The buffer layer 520 is formed on the portions other than the mask layers M1.

The bridging portions 530 are formed so as to be in contact with the mask layers M1. The bridging portions 530 are formed so as to bridge the surfaces of the mask layers M1. The height of one of the bridging portions 530 as measured from the main surface falls within a range of ±10% of the average of the heights of the bridging portions 530 as measured from the main surface.

The semiconductor layer 540 is grown generally from the top portions 532 of the bridging portions 530.

2. Void

The semiconductor structure 500 has voids X5. The voids X5 are first voids. The voids X5 are provided at positions facing the buffer layer 520 formed on the substrate 510. The voids X5 are defined by the buffer layer 520 and the bridging portions 530.

4. Effects of Sixth Embodiment

In the sixth embodiment, the semiconductor layer 540 is grown generally from the top portions 532 of the bridging portions 530. Thus, the semiconductor layer 540 exhibits a relatively low threading dislocation density. That is, the semiconductor layer of the semiconductor structure 500 exhibits high crystallinity.

In the case where the semiconductor structure 500 is a light-emitting device, light emitted from the light-emitting layer is effectively reflected or scattered at the voids X5. Thus, the light-emitting device exhibits high external quantum efficiency.

4. Production Method for Semiconductor Light-Emitting Device

The production method for the semiconductor light-emitting device will be described by focusing on the difference from the first embodiment.

4-1. Step of Forming Mask Layer

The substrate 510 having a flat main surface is provided. The mask layers M1 are formed on the first regions 511a of the main surface of the substrate 510. For example, the mask layers M1 are formed from $SiO_2$.

4-2. Step of Forming Buffer Layer

Subsequently, the buffer layer 520 is formed on the second regions 511b of the main surface of the substrate 510. The second regions correspond to a region of the main surface of the substrate 510 on which no mask layer M1 is formed. In this case, the buffer layer 520 is not formed on the mask layers M1. Even if the buffer layer is formed on the mask layers M1, the buffer layer on the mask layers M1 exhibits poor crystal quality. Thus, the decomposition layer E1 is not grown from the buffer layer on the mask layers M1.

4-3. Step of Forming Decomposition Layer

Thereafter, the decomposition layers E1 are formed on the buffer layer 520. Each decomposition layer E1 is grown so as to cover the second region 511b and a portion of the surfaces of the mask layers M1.

4-4. Step of Forming Bridging Portion

The bridging portions 530 are then formed on the decomposition layers E1. In this case, the lower ends of the bridging portions 530 are in contact with the surfaces of the mask layers M1. The subsequent steps are the same as those described in the first embodiment.

5. Modifications 5-1. Mask Pattern and Bridging Portion Shape

The decomposition layers having any three-dimensional shape can be formed depending on the pattern of the masks M1. The shape of the decomposition layers is transferred to the bridging portions. Thus, the resultant bridging portions can have any shape.

5-2. Combination

The sixth embodiment may use any combination of the first and second embodiments and their modifications.

Seventh Embodiment

1. Semiconductor Light-Emitting Device

Figure 17:
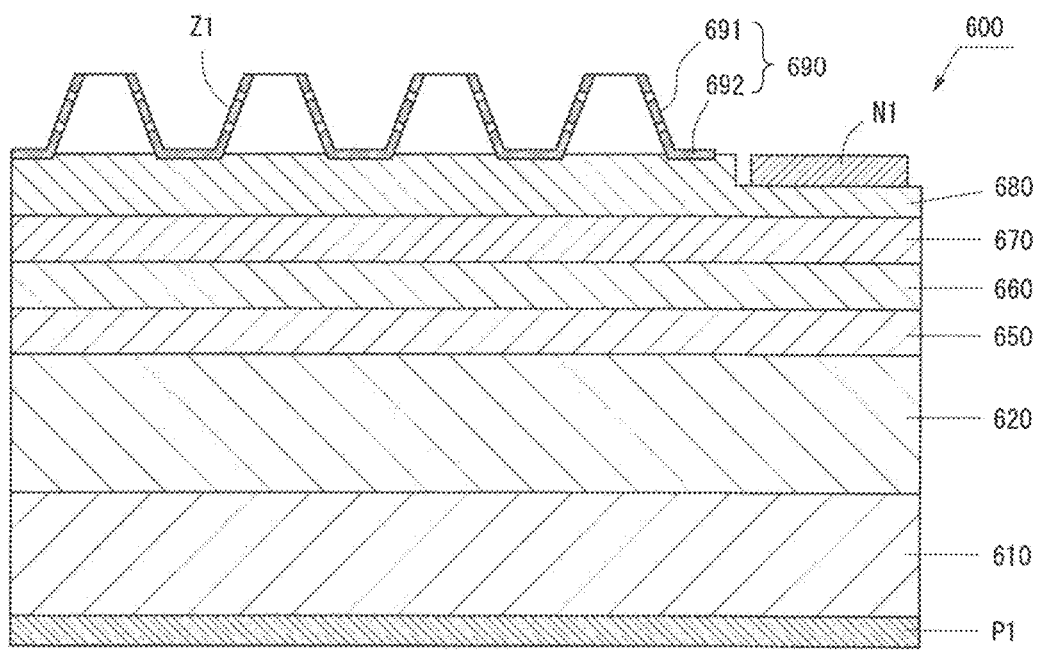
FIG. 17 schematically shows the configuration of a light-emitting device of a seventh embodiment.

FIG. 17 schematically shows the configuration of a light-emitting device 600 of the seventh embodiment. The light-emitting device 600 is produced through removal of a growth substrate. Thus, the light-emitting device 600 does not include a growth substrate (e.g., a sapphire substrate). A light extraction surface Z1 is located on the side of an n-type semiconductor layer.

As shown in FIG. 17, the light-emitting device 600 includes a p-electrode P1, a support substrate 610, a bonding layer 620, an electrically conductive reflective film 650, a p-type semiconductor layer 660, a light-emitting layer 670, an n-type semiconductor layer 680, protrusions 690, and an n-electrode N1. As shown in FIG. 17, the light-emitting device 600 includes the protrusions 690 on the n-type semiconductor layer 680. Each protrusion 690 has a wall portion 691 and a flat portion 692. The wall portion 691 has a tubular shape. The inner diameter of the tubular wall portion 691 decreases in a direction away from the surface of the n-type semiconductor layer 680.

The protrusions 690 extend upward from the surface of the n-type semiconductor layer 680. The protrusions 690 are formed of AlGaN. The protrusions will be described in detail hereinbelow.

The n-electrode N1 is formed on the n-type semiconductor layer 680. If the protrusions 690 are formed of an electrically conductive material, the n-electrode N1 can be formed on the protrusions 690. The n-electrode N1 is formed of a combination of one or more of, for example, Ni, Au, Ag, and Co. Thus, the n-electrode N1 is conducted to the n-type semiconductor layer 680. The n-electrode N1 is a metal electrode and is generally non-transparent.

2. Protrusion 2-1. Structure of Protrusion

The protrusions 690 and the n-type semiconductor layer 680 form the light extraction surface Z1. The protrusions 690 are disposed on the n-type semiconductor layer 680. The protrusions 690 extend upward from the surface of the n-type semiconductor layer 680. Each protrusion 690 has the wall portion 691 and the flat portion 692. The flat portion 692 is in contact with the n-type semiconductor layer 680. The wall portion 691 extends upward from the n-type semiconductor layer 680. The wall portion 691 is disposed so as to intersect with the surface of the n-type semiconductor layer 680.

2-2. Shape of Protrusion

Figure 18:
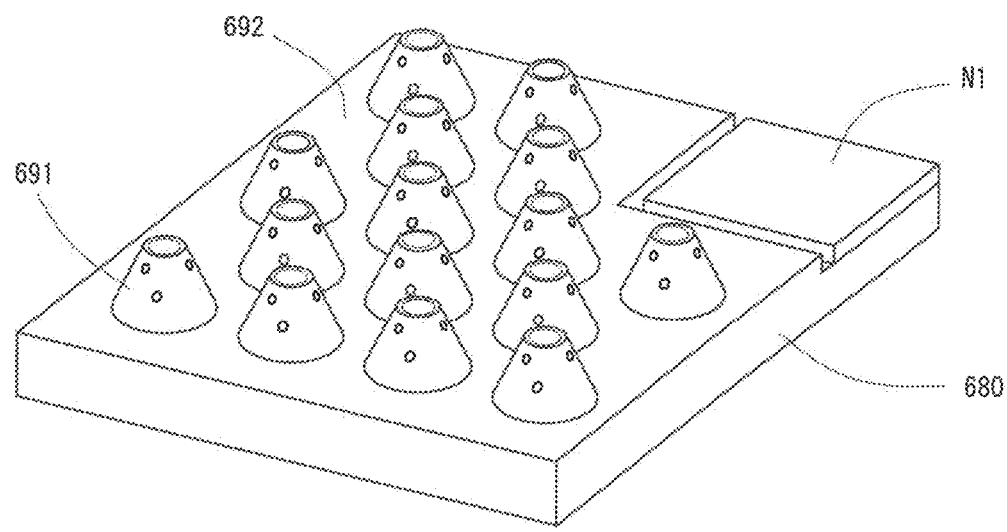
FIG. 18 is a perspective view of the light-emitting device of the seventh embodiment as viewed from an n-electrode side.

FIG. 18 is a perspective view of the light-emitting device 600 as viewed from the n-electrode N1 side. The wall portions 691 are arranged on the n-type semiconductor layer 680 in a honeycomb pattern. Each wall portion 691 has a tapered tubular (approximately cylindrical) shape. As shown in FIGS. 17 and 18, the inner diameter of the tubular wall portion 691 decreases in a direction away from the surface of the n-type semiconductor layer 680. As shown in FIG. 18, the n-type semiconductor layer 680 is exposed in the interior of the tapered cylindrical wall portions 691, and the flat portion 692 is exposed at the exterior of the tapered tubular wall portions 691. The flat portion 692 is connected to the wall portions 691. The wall portions 691 are supported by the flat portion 692.

Figure 19:
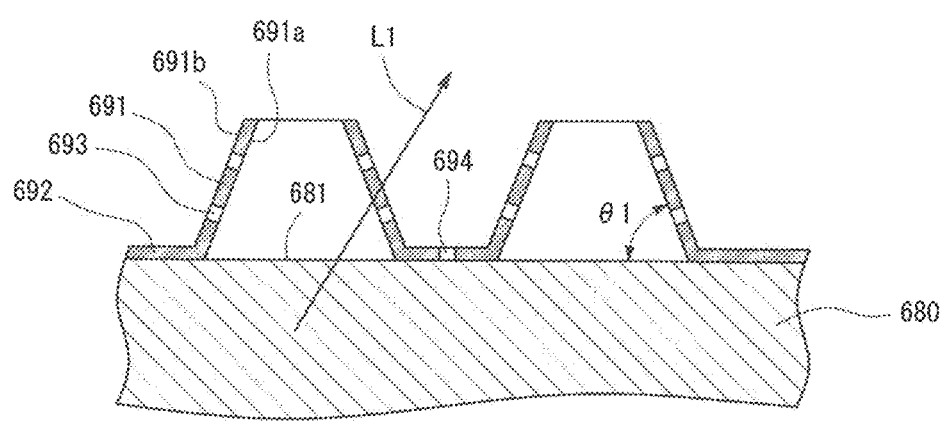
FIG. 19 is an enlarged view of a region around protrusions in the light-emitting device of the seventh embodiment.

FIG. 19 is an enlarged view of a region around the protrusions 690. As shown in FIG. 19, the wall portion 691 of each protrusion 690 has a first surface 691a and a second surface 691b. The first surface 691a faces the n-type semiconductor layer 680 of the light-emitting device 600. The second surface 691b faces the outside of the light-emitting device 600. The second surface 691b is opposite the first surface 691a. In cross-sectional view, the inner diameter of each wall portion 691 decreases in a direction away from the surface 681 of the n-type semiconductor layer 680. The first surface 691a corresponds to the internal surface of the cylindrical tube tapered from the surface 681 of the n-type semiconductor layer 680.

The angle θ1 between the first surface 691a and the n-type semiconductor layer 680 falls within a range of 10° to 85°. The angle θ1 is preferably 30° to 80°, more preferably 45° to 65°. Thus, each protrusion 690 has the first surface 691a which faces the n-type semiconductor layer 680 and makes an acute angle with the n-type semiconductor layer 680.

The protrusions 690 are formed in a periodic manner. The wall portions 691 of the protrusions 690 have almost the same height. Thus, the height of one of the wall portions 691 as measured from the n-type semiconductor layer 680 falls within a range of ±10% of the average of the heights of the wall portions 691 as measured from the n-type semiconductor layer 680. The wall portions 691 are connected to one another via the flat portion 692.

2-3. Thickness of Protrusion

Each protrusion 690 has a thickness of 0.25 nm to 600 nm at its thickest position. The thickness is preferably 0.5 nm to 60 nm, more preferably 1 nm to 30 nm. The thickness of the flat portion 692 is preferably greater than that of the wall portion 691.

2-4. Through Hole of Protrusion

The wall portion 691 of each protrusion 690 has a plurality of through holes 693. The flat portion 692 of the protrusion 690 has a plurality of through holes 694. The density of the through holes 693 of the wall portion 691 is higher than that of the through holes 694 of the flat portion 692. In this case, each semiconductor layer has a low threading dislocation density; i.e., the semiconductor layer exhibits good crystallinity.

The both ends of each through hole 693 of the wall portion 691 are open. One end of each through hole 694 of the flat portion 692 is open. The other end of the through hole 694 of the flat portion 692 is blocked with the n-type semiconductor layer 680.

2-5. Effects of Protrusion

As shown in FIGS. 18 and 19, the light-emitting device 600 of the seventh embodiment has the light extraction surface Z1 having a complicated shape. Thus, as shown in FIG. 19, a portion of light L1 emitted from the light-emitting layer 670 passes through the n-type semiconductor layer 680 to the outside of the light-emitting device 600. The light L1 then enters the wall portion 691 of each protrusion 690 through the first surface 691a, and then passes through the second surface 691b of the wall portion 691 of the protrusion 690 to the outside of the light-emitting device 600. During this process, the light emitted from the light-emitting layer 670 is complicatedly reflected at the first surface 691a and the second surface 691b of the protrusion 690. Thus, the light-emitting device 600 exhibits high external quantum efficiency.

Each protrusion 690 has a plurality of through holes 693 and 694. Accordingly, the light extraction surface Z1 of the protrusion 690 has more complicated irregularities. Thus, the light-emitting device 600 exhibits very high external quantum efficiency.

3. Production Method for Semiconductor Light-Emitting Device

The etching step and the preceding steps are the same as those in the first embodiment.

3-1. Step of Forming n-Type Semiconductor Layer

Subsequently, the n-type semiconductor layer 680 is formed on the bridging portions C10 (protrusions 690). For example, an n-type contact layer, an n-side electrostatic breakdown preventing layer, and an n-side superlattice layer are formed in this order. The n-type semiconductor layer 680 is grown from the top surfaces C10b of the bridging portions C10. The semiconductor layer is barely grown from the leg portions C10a of the bridging portions C10. Most of the threading dislocations Q1 extend toward the leg portions C10a of the bridging portions C10. Accordingly, the threading dislocations barely extend into the n-type semiconductor layer 680. The n-type semiconductor layer 680 is grown in the horizontal direction at least at an initial stage of growth; hence, the through holes C11b of the top portions C10b are effectively filled. Thus, the resultant semiconductor layer exhibits very low threading dislocation density.

The second voids X2 are provided in association with the growth of the n-type semiconductor layer 680 (not illustrated). Each second void X2 is defined by the leg portion C10a of the bridging portion C10, a portion around the top of the substrate A10, and the n-type semiconductor layer 680.

3-2. Other Layer Formation Steps

Thereafter, the light-emitting layer 670 is formed on the n-type semiconductor layer 680. The p-type semiconductor layer 660 is then formed on the light-emitting layer 670. The electrically conductive reflective film 650 is formed on the p-type semiconductor layer 660. The bonding layer 620 is then formed on the electrically conductive reflective film 650.

3-3. Step of Separating Substrate

Subsequently, the substrate A10 is separated from the bridging portions C10. For example, the main surface of the substrate A10 is irradiated with a laser beam. The laser beam is a KrF high-output pulse laser beam having a wavelength of 248 nm. The laser beam may be, for example, a YAG laser beam (355 nm, 266 nm), a XeCl laser beam (308 nm), or an ArF laser beam (155 nm). Any other laser beam having a wavelength shorter than 365 nm may be used.

The bonding region between the substrate A10 and the protrusions 690 has a sufficiently small area. Thus, the substrate A10 is readily removed from the protrusions 690, resulting in separation of the substrate A10 and exposure of the protrusions 690.

3-4. Cleaning Step

Thereafter, the surfaces of the n-type semiconductor layer 680 and the protrusions 690 are cleaned. Specifically, the surfaces are cleaned with an aqueous HCl solution or an aqueous TMAH solution.

3-5. Step of Forming Electrode

Subsequently, the p-electrode P1 is formed on the surface of the support substrate 610 opposite the bonding layer 620. The n-electrode N1 is then formed on the protrusions 690.

3-6. Other Steps

In addition, a protective film may be formed so as to cover the entire surface of the light-emitting device 600.

4. Modifications 4-1. Method for Removing Growth Substrate (Substrate Lift-Off).

In the seventh embodiment, the substrate A10 is separated from the semiconductor layer by the laser lift-off process. Since the adhesion between the protrusions 690 and the substrate A10 is low, the substrate A10 is readily separated from the semiconductor layer. The substrate A10 may be separated from the semiconductor layer by, for example, an etching, tape lift-off, or ultrasonic process. Any other process may be used.

5. Summary of Seventh Embodiment

The light-emitting device 600 of the seventh embodiment has the protrusions 690 having a complicated shape. Accordingly, light emitted from the light-emitting layer 670 is effectively scattered at the protrusions 690. Thus, the light-emitting device 600 exhibits high light extraction performance.

The above-described embodiment is merely an example. Thus, needless to say, various modifications and variations may be made without departing from the scope of the embodiment. For example, the semiconductor layer is not necessarily grown through metal-organic chemical vapor deposition (MOCVD), and may be grown by any other crystal growth method using a carrier gas. Alternatively, the semiconductor layer may be formed by another epitaxial growth method, such as liquid-phase epitaxy or molecular beam epitaxy.

Eighth Embodiment

The eighth embodiment will now be described.

1. Power Device

Figure 20:
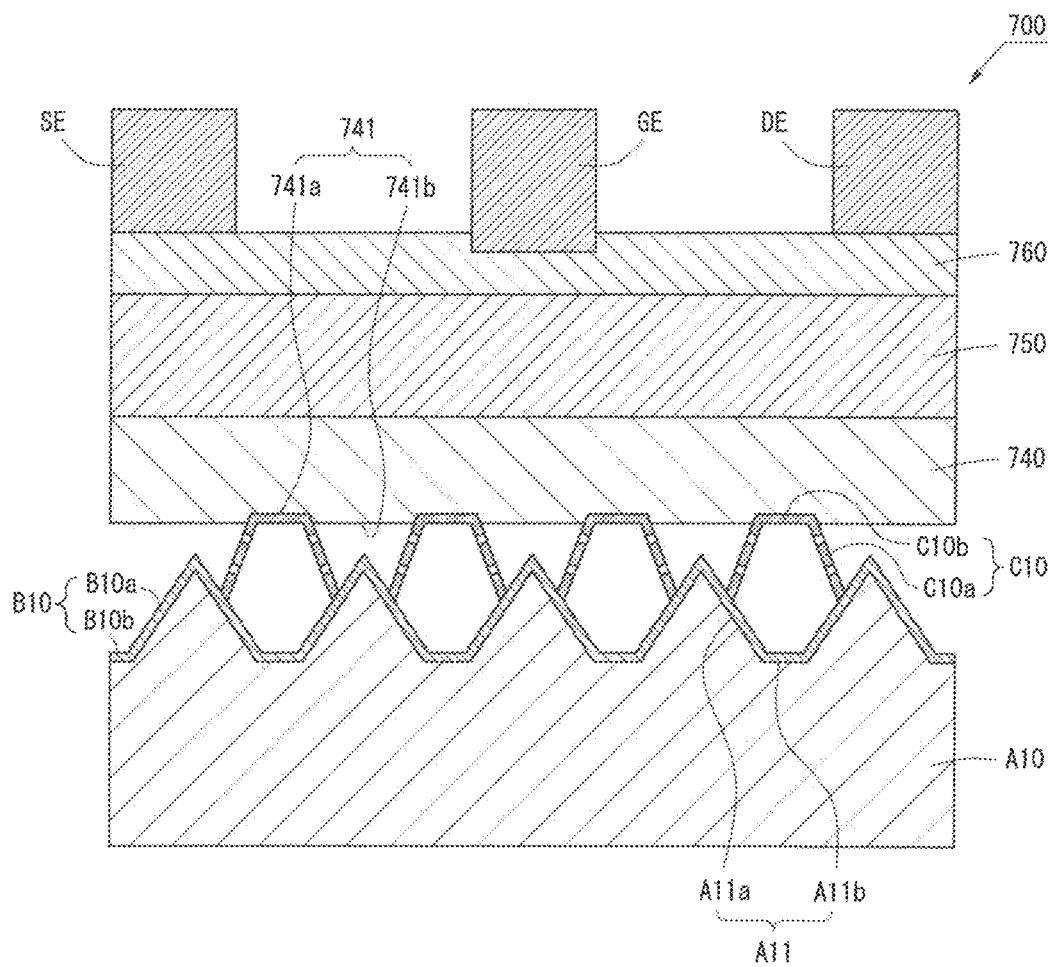
FIG. 20 schematically shows the configuration of a power device of an eighth embodiment.

FIG. 20 schematically shows the configuration of a power device 700 of the eighth embodiment. Needless to say, the power device 700 is a type of semiconductor device. The power device 700 includes a substrate A10, a buffer layer B10, bridging portions C10, an underlying layer 740, a carrier traveling layer 750, a carrier supply layer 760, a gate electrode GE, a source electrode SE, and a drain electrode DE. The source electrode SE and the drain electrode DE are formed on the carrier supply layer 760.

The underlying layer 740 is formed of, for example, AlN or GaN. Carriers supplied from the carrier supply layer 760 travel through the carrier traveling layer 750. The carrier traveling layer 750 is formed of, for example, GaN. The carrier supply layer 760 supplies carriers to the carrier traveling layer 750. The carrier supply layer 760 is formed of, for example, AlGaN.

The underlying layer 740 has a portion 741a of a bottom surface 741 and a remaining portion 741b of the bottom surface 741. The portion 741a of the bottom surface 741 faces the top portions C10b of the bridging portions C10. The remaining portion 741b of the bottom surface 741 is in slight contact with some of the bridging portions C10.

2. Production Method for Power Device

The etching step and the preceding steps are the same as those in the first embodiment.

2-1. Step of Forming Semiconductor Layers

In the eighth embodiment, the semiconductor layer formation step involves a step of forming the carrier traveling layer 750, and a step of forming the carrier supply layer 760 that supplies carriers to the carrier traveling layer 750.

2-2. Step of Forming Electrode

Subsequently, the source electrode SE, the drain electrode DE, and the gate electrode GE are formed.

3. Modifications

As described in the second, seventh, and eighth embodiments, the semiconductor device may include any semiconductor layer or any electrode above the bridging portions C10. Thus, the semiconductor device is applicable to a variety of semiconductor devices, including a light-emitting device and a power device. The eighth embodiment may use any combination of the first and third to sixth embodiments and their modifications. The semiconductor device production method includes a step of forming one or more electrodes that are conducted to at least one semiconductor layer.

4. Effects of Eighth Embodiment

The power device 700 of the eighth embodiment includes the semiconductor layers and the electrodes above the bridging portions C10. The threading dislocations Q1 of the decomposition layers E1 are barely transferred to the semiconductor layer formed above the bridging portions C10. That is, the semiconductor layer exhibits excellent crystallinity. Thus, the power device 700 exhibits high electrostatic breakdown resistance and prevents current leakage.

EXAMPLES

1. Experiment A 1-1. Substrate

Figure 21:
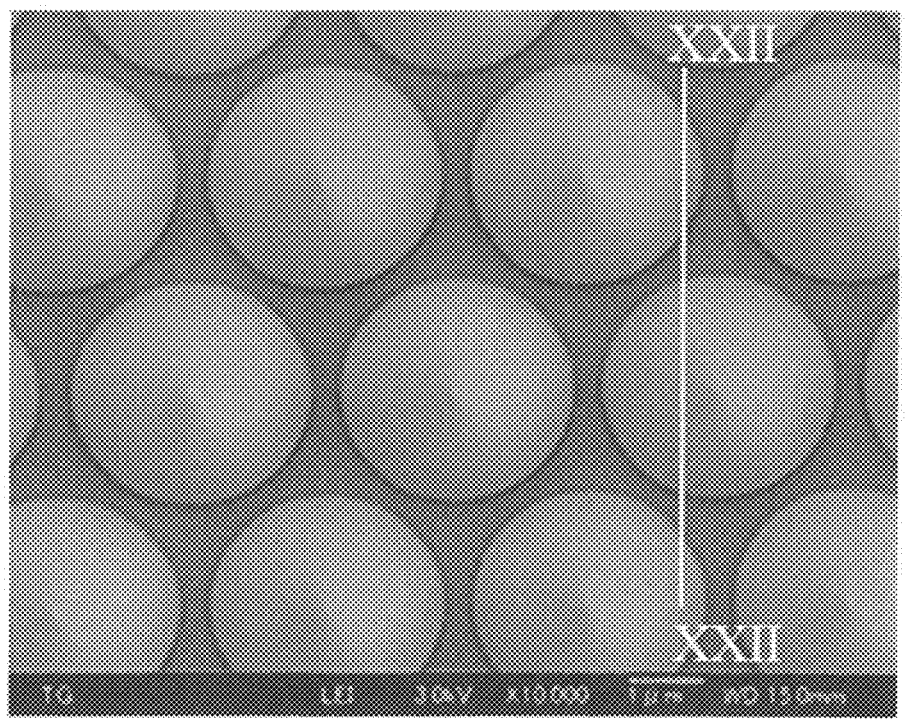
FIG. 21 is a scanning micrograph showing the surface of an uneven sapphire substrate used in experiments A to C.
Figure 22:
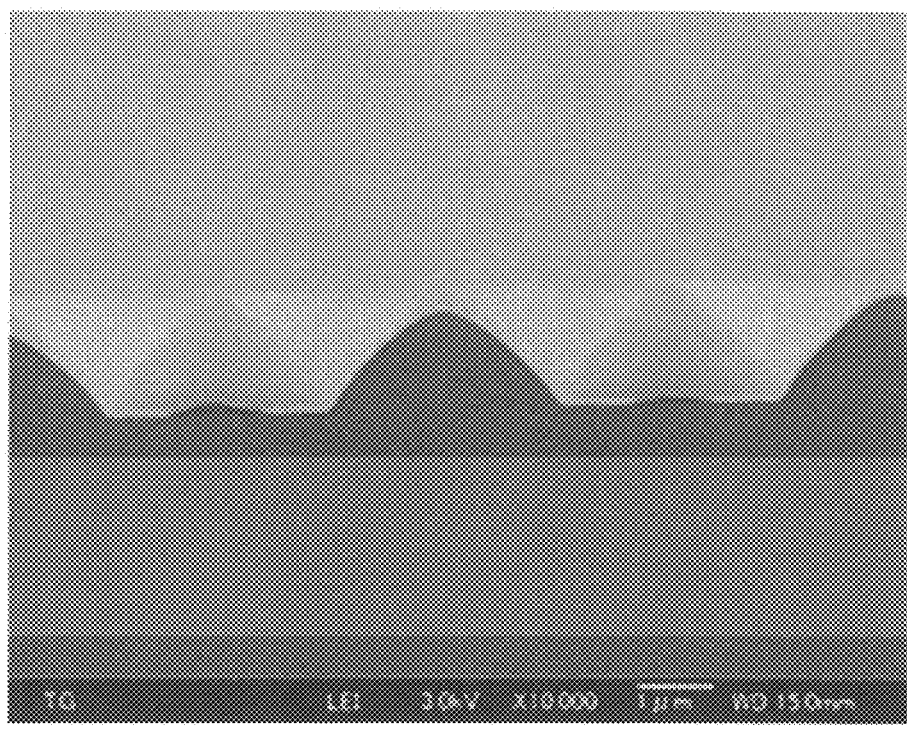
FIG. 22 is a cross-sectional view taken along line XXII-XXII of FIG. 21.

FIG. 21 is a scanning micrograph showing the surface of an uneven sapphire substrate. FIG. 22 is a cross-sectional view taken along line XXII-XXII of FIG. 21. As shown in FIGS. 21 and 22, a plurality of conical protrusions are arranged in a honeycomb pattern.

1-2. Decomposition Layer

Figure 23:
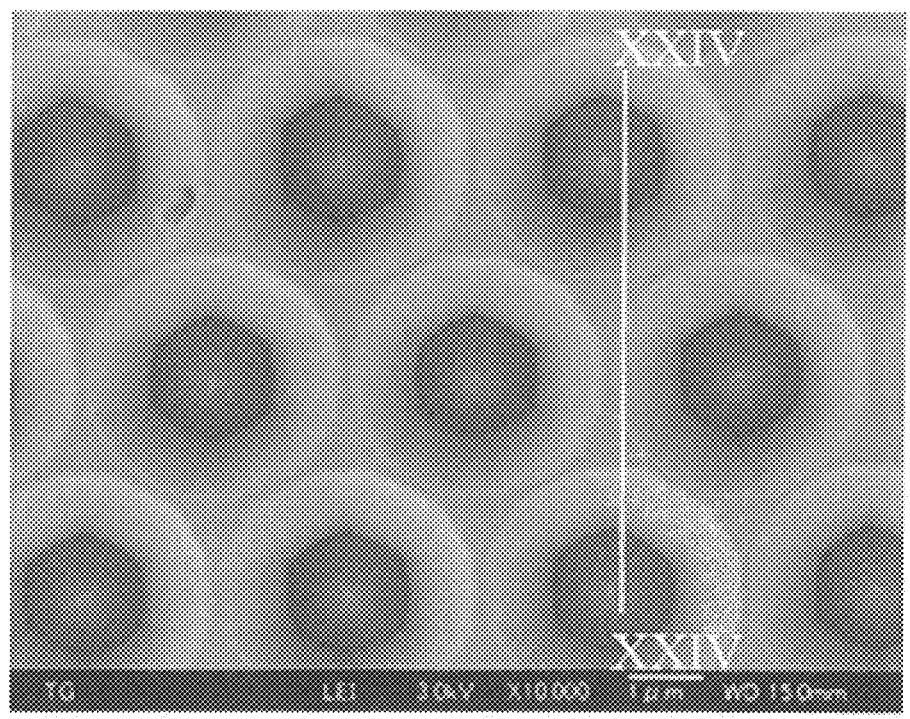
FIG. 23 is a scanning micrograph showing the surface of a structure including a sapphire substrate on which a buffer layer, a decomposition layer, and a bridging portion are formed in experiment A.
Figure 24:
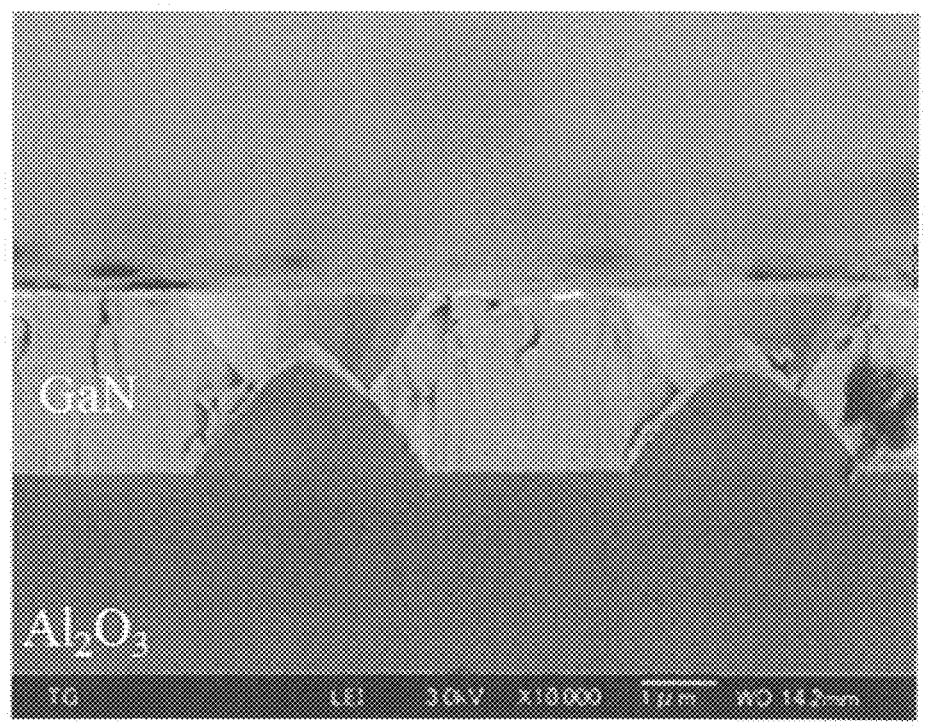
FIG. 24 is a cross-sectional view taken along line XXIV-XXIV of FIG. 23.

FIG. 23 is a scanning micrograph showing the surface of a structure including a sapphire substrate on which a buffer layer, a decomposition layer, and a bridging portion are formed. FIG. 24 is a cross-sectional view taken along line XXIV-XXIV of FIG. 23. The decomposition layer was formed from GaN. The bridging portion was formed from AlN through sputtering. The sputtering time was 50 seconds. The AlN bridging portion has a thickness of 14.3 nm.

1-3. Etching of Decomposition Layer

Figure 25:
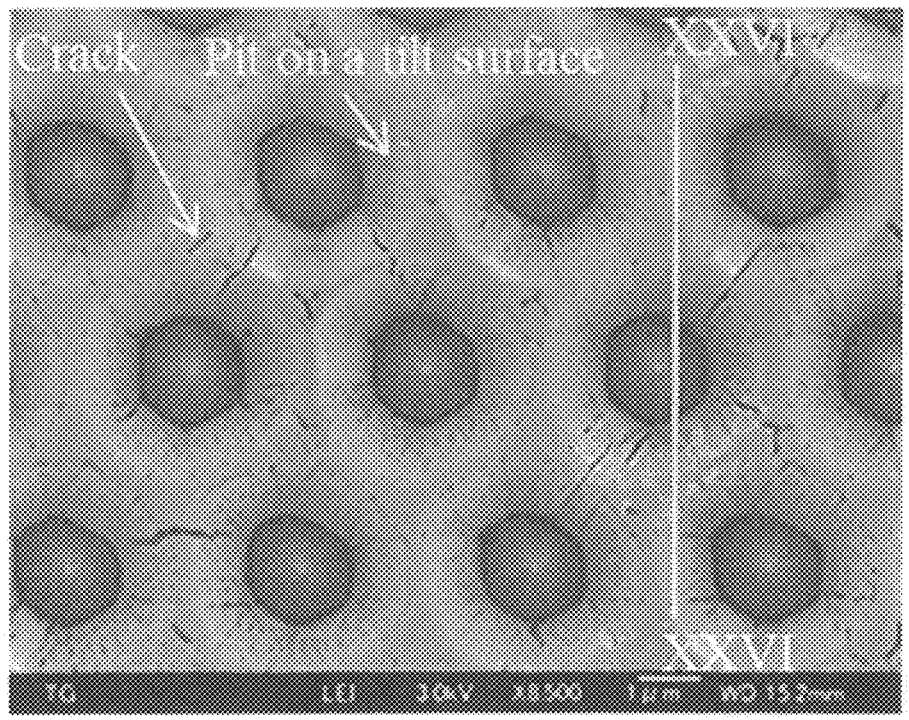
FIG. 25 is a scanning micrograph showing the surface of, for example, the bridging portion after etching of the decomposition layer in experiment A.

FIG. 25 is a scanning micrograph showing the surface of, for example, the bridging portion after etching of the decomposition layer. As shown in FIG. 25, the density of through holes in the leg portion C10a of the bridging portion C10 is higher than the density of through holes in the top portion C10b of the bridging portion C10. Thus, the through holes caused by the threading dislocations are concentrated in the leg portion C10a of the bridging portion C10.

As shown in FIG. 25, cracks are generated partially in the bridging portion C10. Cracks are probably generated during etching or cooling. Thus, cracks are less likely to be generated if the etching and film formation processes are continuously performed. Since the bridging portion C10 is stable as a whole, the semiconductor layer above the bridging portion C10 can be grown without causing any problem.

Figure 26:
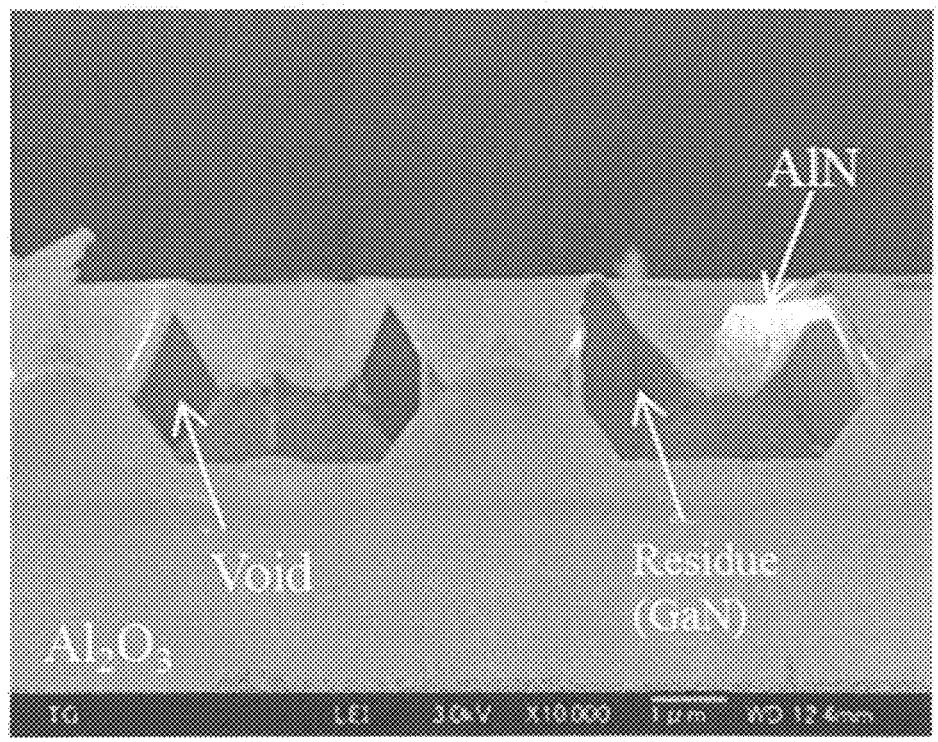
FIG. 26 is a cross-sectional view taken along line XXVI-XXVI of FIG. 25.

FIG. 26 is a cross-sectional view taken along line XXVI-XXVI of FIG. 25. As shown in FIG. 26, voids are observed on the left side, and a residue of the GaN decomposition layer is observed on the right side.

1-4. Position of Through Hole

As shown in FIG. 25, the through holes are concentrated in the leg portion C10a of the bridging portion C10. The semiconductor layer above the bridging portion C10 is grown from the top portion C10b of the bridging portion C10. Accordingly, the semiconductor layer above the bridging portion C10 exhibits a relatively low threading dislocation density. Thus, the semiconductor layer above the bridging portion C10 exhibits excellent crystallinity.

2. Experiment B 2-1. Formation of Layers (Including Decomposition Layer)

The same uneven substrate as in experiment A was used in experiment B. A GaN layer (decomposition layer) was formed through MOCVD. An AlGaN layer (bridging portion) was formed through MOCVD. The Al content of the AlGaN layer was %. The thickness of the AlGaN layer was 25.8 nm.

2-1. Etching of Decomposition Layer

Figure 27:
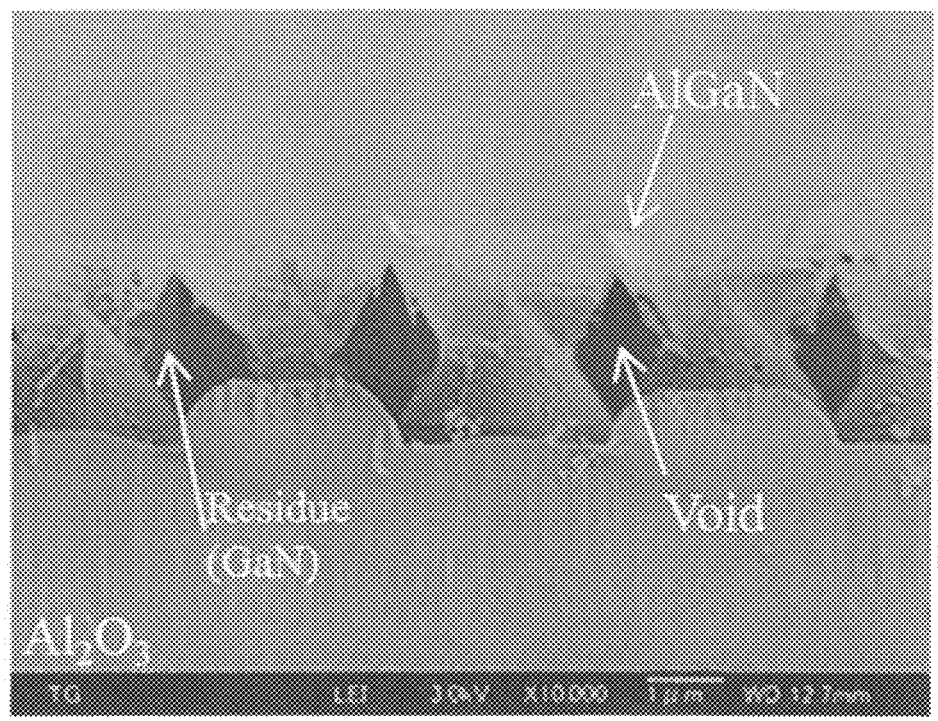
FIG. 27 is a scanning micrograph showing a cross section in the case of formation of an AlGaN layer for a bridging portion in experiment B.

FIG. 27 is a scanning micrograph showing a cross section in the case of formation of an AlGaN layer for a bridging portion. Even if the bridging portion is formed of an AlGaN layer, voids can be provided. In the case where the decomposition layer was formed of a GaN layer, the bridging portion was able to be formed of an AlGaN layer having an Al content of 5% to 35%.

In the case where the bridging portion is formed of an AlGaN layer, the composition of the bridging portion is similar to that of the decomposition layer when the Al content of the AlGaN layer is low. In such a case, the difference in lattice constant is reduced between the bridging portion and the decomposition layer. Thus, generation of cracks can be prevented. However, in such a case, the thermal decomposition temperature of the bridging portion is approximate to that of the decomposition layer. Thus, the bridging portion may undergo damage during thermal decomposition of the decomposition layer. Meanwhile, the composition of the bridging portion differs from that of the decomposition layer when the Al content of the AlGaN layer is high. In such a case, the bridging portion can be prevented from undergoing damage during thermal decomposition of the decomposition layer, but cracks are likely to be generated.

3. Experiment C 3-1. Formation of Layers (Including Decomposition Layer)

The same uneven substrate as in experiment A was used in experiment C. A GaN layer (decomposition layer) was formed through MOCVD. A low-temperature AlN layer (bridging portion) was formed through MOCVD at a low temperature of 300° C. to 600° C. The thickness of the low-temperature AlN layer was 25.8 nm.

3-2. Etching of Decomposition Layer

Figure 28:
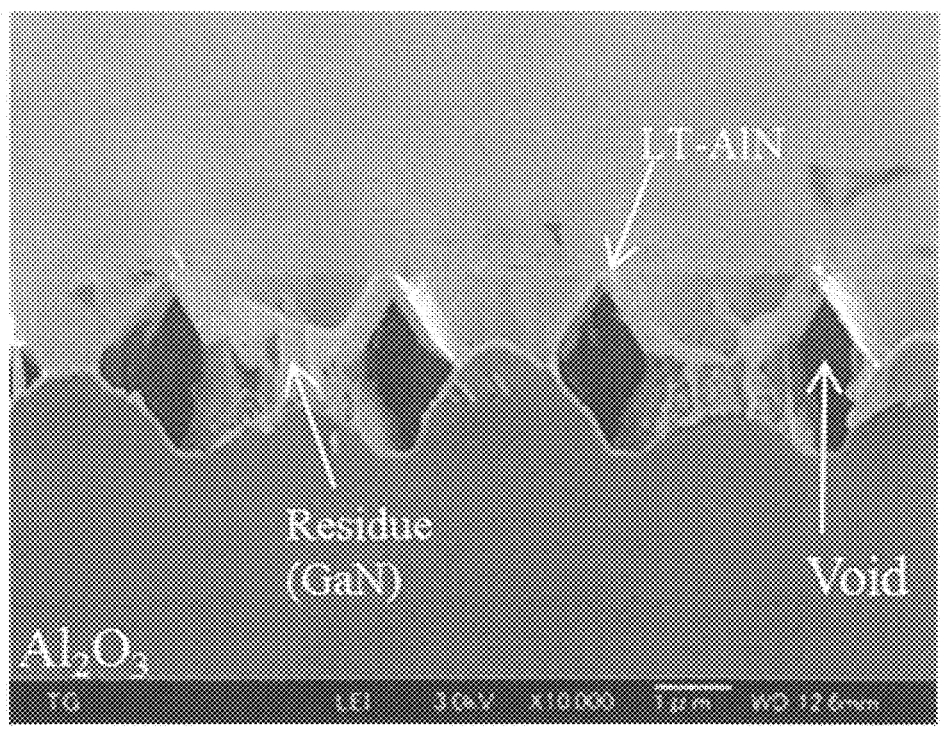
FIG. 28 is a scanning micrograph showing a cross section in the case of formation of a low-temperature AlN layer for a bridging portion in experiment C.

FIG. 28 is a scanning micrograph showing a cross section in the case of formation of a low-temperature AlN layer for a bridging portion. Even if the bridging portion is formed of a low-temperature AlN layer, voids can be provided.

4. Experiment D 4-1. Substrate

A substrate having a stripe-pattern unevenly shaped portion was used. A GaN layer having non-polar m-plane (decomposition layer) was formed through MOCVD, and an AlGaN layer (bridging portion) was formed through MOCVD.

4-2. Etching of Decomposition Layer

Figure 29:
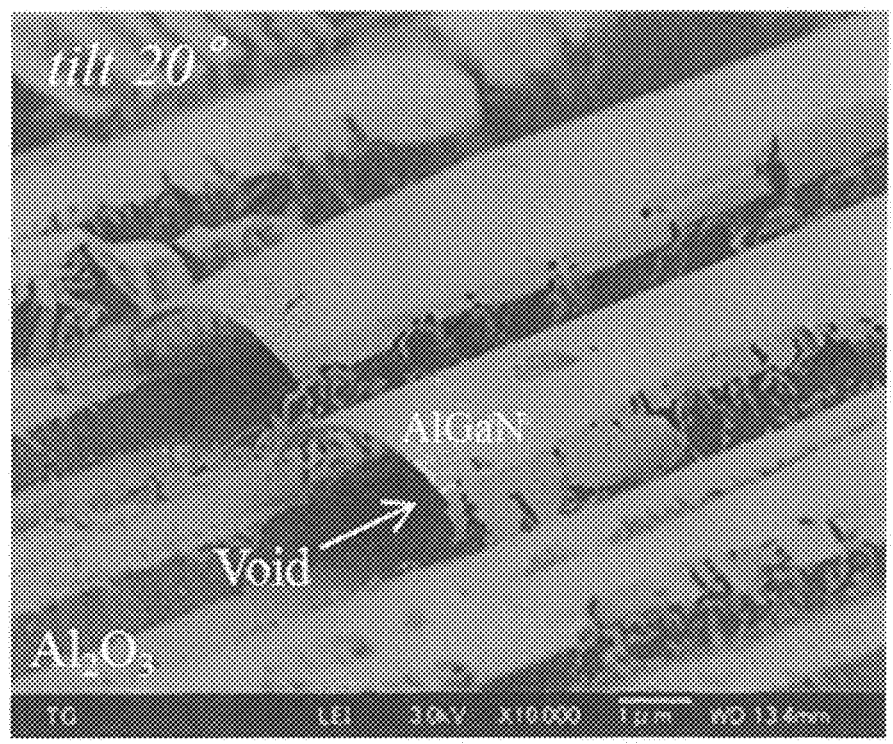
FIG. 29 is a scanning micrograph showing a region around a bridging portion after etching of a decomposition layer in experiment D.
Figure 30:
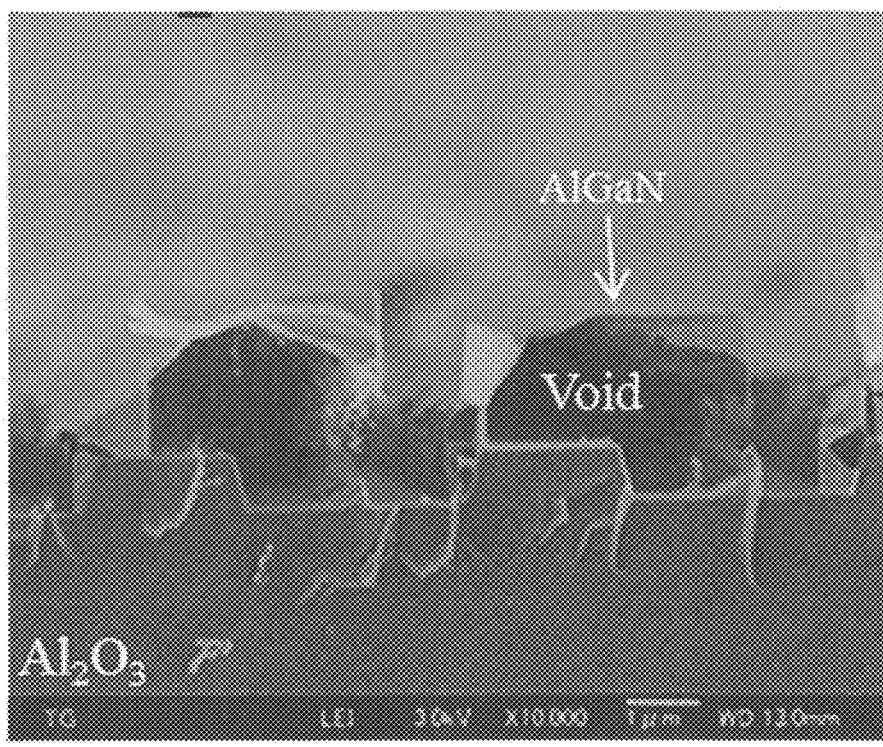
FIG. 30 is a scanning micrograph showing a cross section around the bridging portion after etching of the decomposition layer in experiment D.

FIG. 29 is a scanning micrograph showing a region around the bridging portion after etching of the decomposition layer. FIG. 30 is a scanning micrograph showing a cross section around the bridging portion after etching of the decomposition layer. As shown in FIGS. 29 and 30, voids are observed between the substrate and the AlGaN layer.

5. Experiment E 5-1. Thickness of Bridging Portion

Suitable voids were provided in the case where the thickness of the bridging portion C10 was about 8 nm to about 60 nm.

6. Experiment F 6-1. Production of Sample

A sample was produced by the method for producing the light-emitting device 100 of the second embodiment. Thus, the growth substrate is a substrate having conical protrusions arranged in a honeycomb pattern. The buffer layer is a low-temperature AlN buffer layer. The protrusions (bridging portions) were formed from AlN through sputtering. Thereafter, semiconductor layers (including an n-type semiconductor layer) were formed. Subsequently, the growth substrate was removed from the n-type semiconductor layer through etching.

6-2. Image

Figure 31:
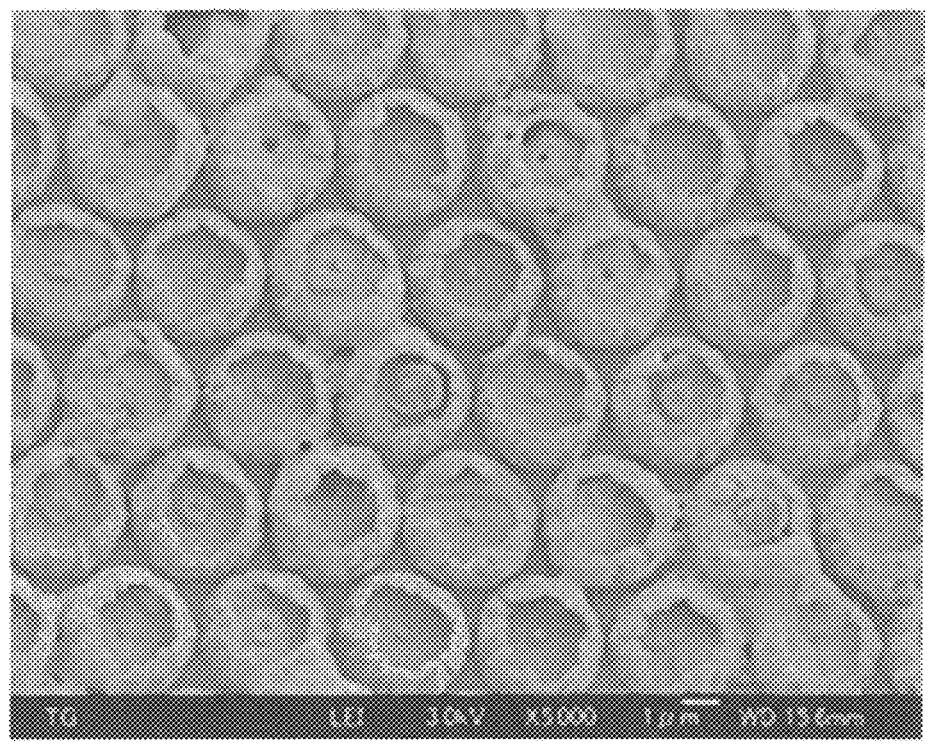
FIG. 31 is a scanning micrograph showing a portion corresponding to protrusions in experiment F (part 1)
Figure 32:
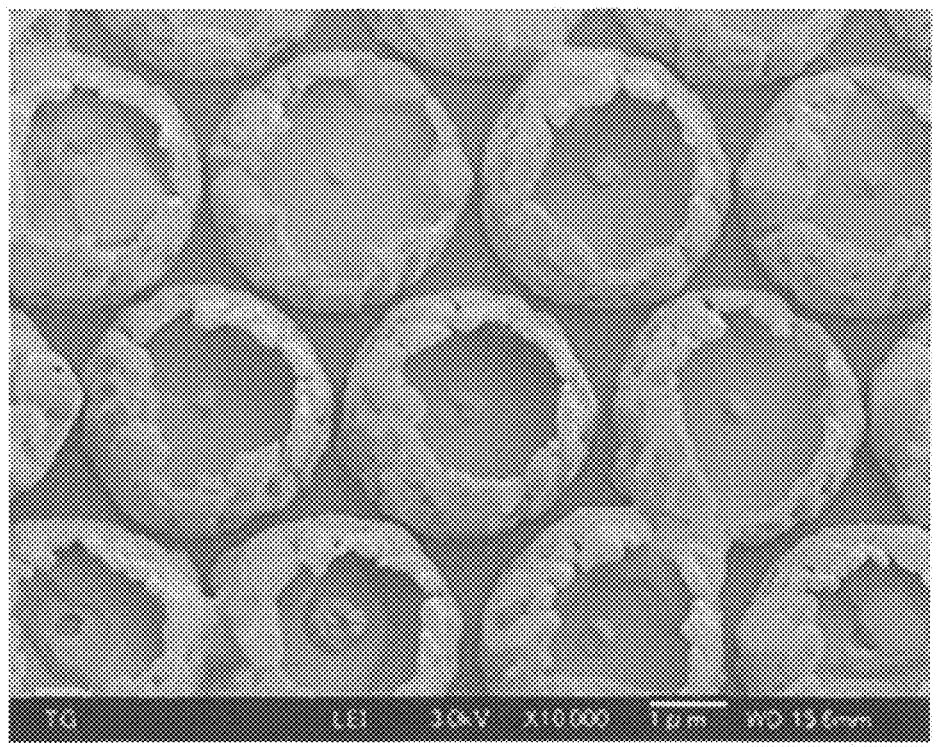
FIG. 32 is a scanning micrograph showing a portion corresponding to the protrusions in experiment F (part 2).

FIG. 31 is a scanning micrograph showing a portion corresponding to the protrusions (part 1). FIG. 32 is a scanning micrograph showing a portion corresponding to the protrusions (part 2). As shown in FIGS. 31 and 32, each protrusion has an approximately cylindrical shape. The inner diameter of the cylindrical protrusion decreases in a direction away from the surface of the n-type semiconductor layer.

What is claimed is:

1. A method for producing a semiconductor structure, the method comprising:
    forming a decomposition layer on a substrate;
    forming a bridging portion on the decomposition layer;
    decomposing the decomposition layer; and
    forming at least one semiconductor layer on the bridging portion, wherein,
    in the decomposition layer formation, a plurality of threading dislocations are extended during growth of the decomposition layer;
    in the bridging portion formation, the threading dislocations are exposed to the surface of the bridging portion; and
    in the decomposition of the decomposition layer, the threading dislocations exposed to the surface of the bridging portion are widened to thereby provide a plurality of through holes penetrating the bridging portion, and the decomposition layer exposed in the interior of the through holes is decomposed.

2. A method for producing a semiconductor structure according to claim 1, wherein, in the decomposition of the decomposition layer, a decomposition product generated through decomposition of the decomposition layer is discharged via the through holes to the outside of the bridging portion, to thereby provide a first void in a region where the decomposition layer has remained.

3. A method for producing a semiconductor structure according to claim 2, wherein, in the decomposition of the decomposition layer, a residue containing GaN or InGaN is caused to remain in the first void.

4. A method for producing a semiconductor structure according to claim 1, wherein, in the bridging portion formation, the bridging portion is formed so as to have a leg portion and a top portion, and, in the semiconductor layer formation, the semiconductor layer is grown from the top portion of the bridging portion.

5. A method for producing a semiconductor structure according to claim 4, wherein, in the semiconductor layer formation, the semiconductor layer is formed so as not to block at least some of first through holes provided in the leg portion, but to block second through holes provided in the top portion.

6. A method for producing a semiconductor structure according to claim 5, wherein, in the decomposition layer formation, the decomposition layer is grown generally in the vertical direction at an initial stage of growth and is grown generally in the horizontal direction at a later stage of growth, and, in the decomposition of the decomposition layer, the density of the first through holes is adjusted to be higher than that of the second through holes.

7. A method for producing a semiconductor structure according to claim 4, wherein, in the bridging portion formation, the bridging portion is formed so that the top portion has a thickness greater than that of the leg portion.

8. A method for producing a semiconductor structure according to claim 1, wherein, in the decomposition layer formation, an uneven substrate having an unevenly shaped portion having a bottom portion and a plurality of protrusions is provided, and the decomposition layer is formed on the unevenly shaped portion of the uneven substrate.

9. A method for producing a semiconductor structure according to claim 8, wherein, in the bridging portion formation, the height at a position of the bridging portion as measured from the bottom portion of the substrate is adjusted to fall within a range of ±10% of the average height of the bridging portion as measured from the bottom portion.

10. A method for producing a semiconductor structure according to claim 8, wherein, in the bridging portion formation, the distance between the top of the bridging portion and the bottom portion of the substrate is adjusted to be greater than the distance between the tops of the protrusions of the substrate and the bottom portion of the substrate.

11. A method for producing a semiconductor structure according to claim 1, wherein the method further comprises forming a mask layer on a first region of a flat main surface of a substrate, wherein, in the decomposition layer formation, the decomposition layer is formed on a second region of the main surface on which the mask layer is not formed.

12. A method for producing a semiconductor structure according to claim 1, wherein, in the decomposition layer formation, the decomposition layer is formed on a flat main surface of a substrate.

13. A method for producing a semiconductor structure according to claim 1, wherein, in the bridging portion formation, the bridging portion is formed from an Al-containing Group III nitride.

14. A method for producing a semiconductor structure according to claim 1, wherein at least one crack is formed in the bridging portion.

15. A method for producing a semiconductor structure according to claim 1, wherein, in the bridging portion formation, the bridging portion is formed so as to have a thickness of 0.25 nm to 100 nm at its thickest position.

16. A method for producing a semiconductor structure according to claim 1, wherein, in the bridging portion formation, a facet plane is formed on at least a portion of the surface of the bridging portion.

17. A method for producing a semiconductor structure according to claim 1, wherein the method further comprises separating the substrate from the semiconductor layer.

18. A method for producing a semiconductor device, the method comprising:
forming a decomposition layer on a substrate;
forming a bridging portion on the decomposition layer;
decomposing the decomposition layer;
forming one or more semiconductor layers on the bridging portion; and
forming one or more electrodes that are conducted to at least one of the semiconductor layers, wherein
in the decomposition layer formation, a plurality of threading dislocations are extended during growth of the decomposition layer;
in the bridging portion formation, the threading dislocations are exposed to the surface of the bridging portion; and
in the decomposition of the decomposition layer, the threading dislocations exposed to the surface of the bridging portion are widened to thereby provide a plurality of through holes penetrating the bridging portion, and the decomposition layer exposed in the interior of the through holes is decomposed.

19. A method for producing a semiconductor device according to claim 18, wherein the semiconductor layer formation comprises forming a first semiconductor layer of a first conductive type; forming a light-emitting layer on the first semiconductor layer; and forming a second semiconductor layer of a second conductive type on the light-emitting layer.

20. A method for producing a semiconductor device according to claim 18, wherein the semiconductor layer formation comprises forming a carrier traveling layer, and forming a carrier supply layer that supplies carriers to the carrier traveling layer.

* * * * *